United States Patent
Ramaswamy

(10) Patent No.: US 10,340,331 B2
(45) Date of Patent: Jul. 2, 2019

(54) METHODS OF FORMING AN ARRAY OF CAPACITORS, METHODS OF FORMING AN ARRAY OF MEMORY CELLS INDIVIDUALLY COMPRISING A CAPACITOR AND A TRANSISTOR, ARRAYS OF CAPACITORS, AND ARRAYS OF MEMORY CELLS INDIVIDUALLY COMPRISING A CAPACITOR AND A TRANSISTOR

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/045,573

(22) Filed: Jul. 25, 2018

(65) Prior Publication Data
US 2018/0350895 A1    Dec. 6, 2018

Related U.S. Application Data

(62) Division of application No. 15/401,372, filed on Jan. 9, 2017, now Pat. No. 10,062,745.

(51) Int. Cl.
*H01L 27/108*    (2006.01)
*H01L 49/02*    (2006.01)
(Continued)

(52) U.S. Cl.
CPC ........ *H01L 28/60* (2013.01); *H01L 27/10811* (2013.01); *H01L 27/10814* (2013.01);
(Continued)

(58) Field of Classification Search
CPC ......... H01L 28/60; H01L 28/87; H01L 28/88; H01L 28/91; H01L 27/10811;
(Continued)

(56) References Cited

U.S. PATENT DOCUMENTS 6,437,401 B1    8/2002 Mandelman et al.
9,287,270 B2 *  3/2016 Oh ....................... H01L 27/1085
(Continued)

FOREIGN PATENT DOCUMENTS

TW            571384       1/2004
TW          201546804    12/2016

*Primary Examiner* — Tu-Tu V Ho
(74) *Attorney, Agent, or Firm* — Wells St. John P.S.

(57) ABSTRACT

A method of forming an array of capacitors comprises forming elevationally-extending and longitudinally-elongated capacitor electrode lines over a substrate. Individual of the capacitor electrode lines are common to and a shared one of two capacitor electrodes of individual capacitors longitudinally along a line of capacitors being formed. A capacitor insulator is formed over a pair of laterally-opposing sides of and longitudinally along individual of the capacitor electrode lines. An elevationally-extending conductive line is formed over the capacitor insulator longitudinally along one of the laterally-opposing sides of the individual capacitor electrode lines. The conductive line is cut laterally through to form spaced individual other of the two capacitor electrodes of the individual capacitors. Other methods are disclosed, including structures independent of method of manufacture.

8 Claims, 30 Drawing Sheets

(51) Int. Cl.
  *H01L 27/11507* (2017.01)
  *H01L 29/66* (2006.01)
(52) U.S. Cl.
  CPC .. *H01L 27/10817* (2013.01); *H01L 27/10852* (2013.01); *H01L 27/10885* (2013.01); *H01L 27/11507* (2013.01); *H01L 28/87* (2013.01); *H01L 28/91* (2013.01); *H01L 29/66666* (2013.01)
(58) Field of Classification Search
  CPC ......... H01L 27/10814; H01L 27/10817; H01L 27/10852; H01L 27/10885; H01L 27/11507; H01L 29/66666
  USPC ........................................................ 257/308
  See application file for complete search history.

(56) References Cited

U.S. PATENT DOCUMENTS

| | | |
|---|---|---|
| 2004/0235240 A1 | 11/2004 | Hsu et al. |
| 2015/0221718 A1 | 8/2015 | Rhie |
| 2018/0122817 A1 | 5/2018 | Ramaswamy |

\* cited by examiner

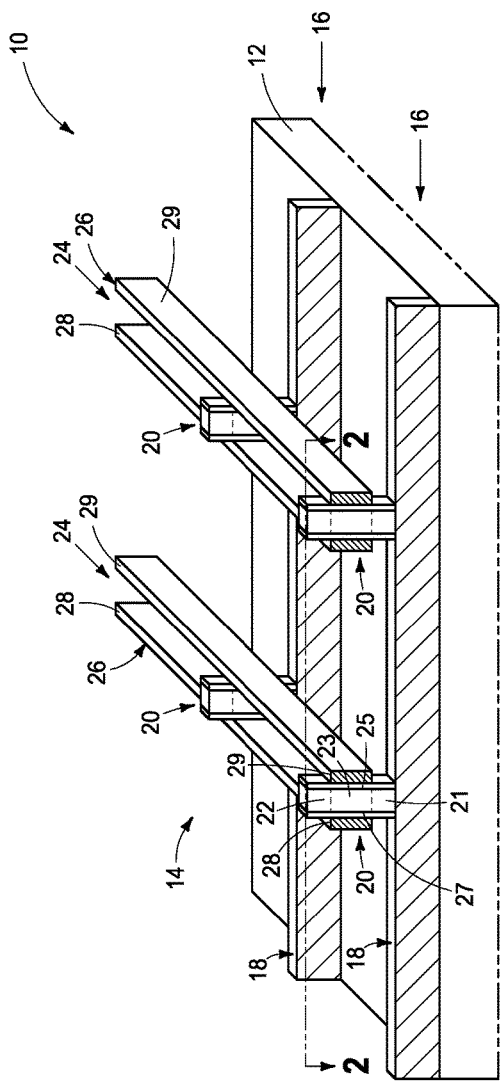
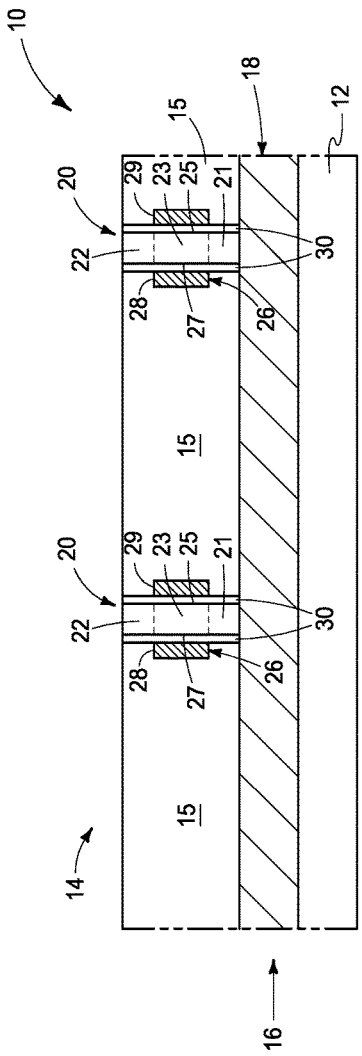
FIG. 1
FIG. 2

US 10,340,331 B2

METHODS OF FORMING AN ARRAY OF CAPACITORS, METHODS OF FORMING AN ARRAY OF MEMORY CELLS INDIVIDUALLY COMPRISING A CAPACITOR AND A TRANSISTOR, ARRAYS OF CAPACITORS, AND ARRAYS OF MEMORY CELLS INDIVIDUALLY COMPRISING A CAPACITOR AND A TRANSISTOR

This patent resulted from a divisional application of U.S. patent application Ser. No. 15/401,372, filed Jan. 9, 2017, entitled "Methods Of Forming An Array Of Capacitors, Methods Of Forming An Array Of Memory Cells Individually Comprising A Capacitor And A Transistor, Arrays Of Capacitors, And Arrays Of Memory Cells Individually Comprising A Capacitor And A Transistor", naming Durai Vishak Nirmal Ramaswamy as inventor, the disclosure of which is incorporated by reference.

TECHNICAL FIELD

Embodiments disclosed herein pertain to methods of forming an array of capacitors, to methods of forming an array of memory cells individually comprising a capacitor and a transistor, to arrays of capacitors, and to arrays of memory cells individually comprising a capacitor and a transistor.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

BRIEF DESCRIPTION OF THE DRAWINGS

FIG. 1 is a diagrammatic perspective view of a substrate construction in process in accordance with an embodiment of the invention.

FIG. 2 is a front elevational view of the FIG. 1 construction taken through line 2-2 in FIG. 1.

DETAILED DESCRIPTION OF EXAMPLE EMBODIMENTS

Figure 4:
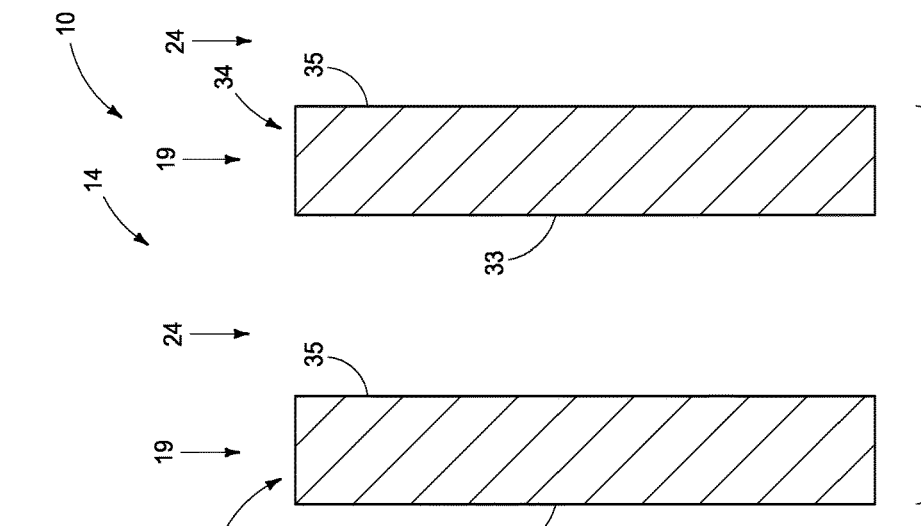
FIG. 4 is a cross-sectional view taken through line 4-4 in FIG. 3.

Embodiments of the invention encompass methods of forming an array of capacitors and arrays of capacitors independent of method of manufacture. Embodiments of the invention also encompass methods of forming an array of memory cells individually comprising a capacitor and a transistor and arrays of memory cells independent of method of manufacture. Example embodiments of methods of forming such arrays are initially described with reference to FIGS. 1-19.

Referring to FIGS. 1 and 2, such depict a portion of a substrate fragment or construction 10 comprising a base substrate 12 having an array or array area 14 within which an array of memory cells individually comprising a transistor and a capacitor will be fabricated. An area (not shown) is peripheral to array 14 and may be fabricated to include circuit components (i.e., circuitry). Individual memory cells will be fabricated within array 14 and array 14 may comprise rows of access lines and columns of data/sense lines. Use of "rows" and "columns" herein is with respect to a series of access lines and a series of data/sense lines, respectively, and longitudinally along which individual memory cells have been or will be formed within array 14. The rows may be straight and/or curved and/or parallel and/or non-parallel relative one another, as may be the columns. Further, the rows and columns may intersect relative one another at 90° or at one or more other angles. The peripheral area may be considered as starting and array 14 may be considered as stopping where a repeating pattern of memory cells stops (e.g., at peripheral edges of such a repeating pattern) although the rows of access lines and/or the columns of data/sense lines may and likely will extend into the peripheral area.

Base substrate 12 may include any one or more of conductive/conductor/conducting (i.e., electrically herein), semiconductive, or insulative/insulator/insulating (i.e., electrically herein) materials. Various materials are shown above base substrate 12. Materials may be aside, elevationally inward, or elevationally outward of the depicted FIGS. 1 and 2 materials. For example, other partially or wholly fabricated components of integrated circuitry may be provided somewhere above, about, or within substrate 12. Control and/or other peripheral circuitry for operating components within a memory array may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Regardless, any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Columns 16 of data/sense lines 18 have been formed over base substrate 12. In one embodiment, columns 16 are lower columns and data/sense lines 18 are lower data/sense lines as will be apparent from the continuing discussion. In this document, unless otherwise indicated, "elevational(ly)", "higher", "upper", "lower", "top", "atop", "bottom", "above, "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations. For simplicity and ease of depiction, only two data/sense lines 18 are shown although thousands, tens of thousands, etc. would likely be formed within array 14. Further, such lines and columns are shown as being straight-linear although again curved, non-parallel, combination of curved and straight segmented, etc. configurations may be used.

Example material for conductive data/sense lines 18 is one or more of elemental metal, a mixture or alloy of two or more elemental metals, conductive metal compounds, and conductively-doped semiconductive materials, with TiN being one specific example. An example elevational thickness for data/sense lines 18 is 150 to 350 Angstroms.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Transistors 20 have been formed over columns 16 of data/sense lines 18. In one embodiment, transistors 20 extend elevationally and in one embodiment are vertical transistors. In one embodiment, transistors 20 are lower transistors. Individual transistors 20 comprise a source/drain region 21 (e.g., a lower source/drain region) electrically coupled (in one embodiment directly electrically coupled) to one of data/sense lines 18, a source/drain region 22 (e.g., an upper source/drain region), and a channel 23 (e.g., polysilicon) between source/drain regions 21 and 22. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. Source/drain regions 21, 22 and channels 23 individually are shown to be of quadrilateral shape in horizontal cross-section, and with four straight lateral sides, for an elevationally-extending transistor 20. Alternate shapes including fewer, more, non-straight, and/or curved sides may be used. For purposes of the continuing discussion, channels 23 have four sides in the depicted embodiment, with only two laterally-opposing sides 25 and 27 being numerically designated in FIG. 2.

Transistors 20 comprise rows 24 of access lines 26 above data/sense lines 18 that extend operatively adjacent transistor channels 23 and which interconnect transistors 20 in that row. In one embodiment where transistors 20 are elevationally-extending transistors, access lines 26 extend laterally across and operatively adjacent a lateral side 25 and/or 27 of transistor channels 23. Where so there-adjacent, such comprises a portion of the access line that effectively forms an access gate for the individual transistors. In one embodiment, access lines 26 may be considered as lower access lines. FIGS. 1 and 2 show only four transistors 20 and two access lines 26 although likely thousands, tens of thousands, etc. access lines would be included and resulting in hundreds of thousands, millions, etc. transistors 20 within array 14. In one embodiment and as shown where transistors 20 extend elevationally, individual access lines 26 are in the form of access line pairs 28, 29 that are laterally across and operatively laterally adjacent laterally-opposing sides 25, 27 of individual channels 23 within array 14. Material of access lines 26 may be as described above with respect to data/sense lines 18, and such may be of the same or different composition relative one another. An example lateral thickness for each of pairs 28 and 29 is 30 to 750 Angstroms. Access lines 26 are shown as being straight-linear although again curved, non-parallel, combination of curved and straight segmented, etc. configurations may be used. The access lines may individually completely encircle (not shown) respective individual transistor channels or may only be over a portion of the circumference of such channels, for example only being over opposing lateral sides of the transistor channels.

Gate insulator 30 (e.g., silicon dioxide, silicon nitride, high-k dielectric, ferroelectric material, etc.) is between access line pairs 28, 29 and transistor channel 23. Dielectric material 15 (e.g., $Si_3N_4$ and/or doped and/or undoped $SiO_2$) is atop substrate 12 and between data/sense lines 18 and is not shown in FIG. 1 or other perspective views for clarity of operative circuit components.

Figure 3:
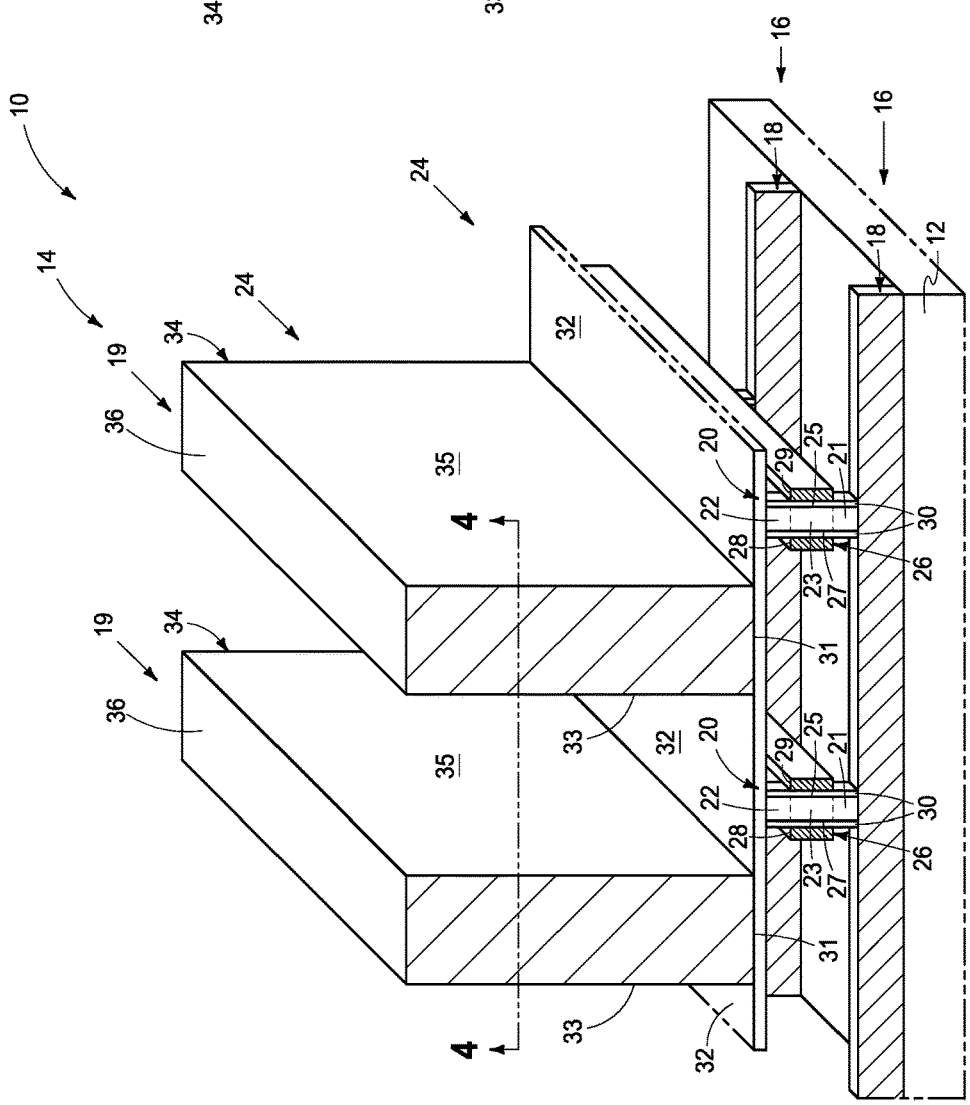
FIG. 3 is a view of the FIG. 1 construction at a processing step subsequent to that shown by FIGS. 1 and 2.

Referring to FIGS. 3 and 4, a material 32 (e.g., $Si_3N_4$ that may be used as an etch stop) has been formed over dielectric material 15 (not shown) as part of construction 10. Elevationally-extending and longitudinally-elongated capacitor electrode lines 34 have been formed over material 32, and in one embodiment laterally to one side of a line (e.g., individual row lines 24) of transistors 20. Capacitor electrode lines 34 may be of any suitable conductive material, for example including any of the materials described above for data/sense lines 18 and access lines 26. Individual of capacitor electrode lines 34 will be common to and a shared one of two capacitor electrodes of individual capacitors that are longitudinally along a line (e.g., individual lines 19) of capacitors being formed longitudinally along a line (e.g., 24) of transistors 20. Capacitor electrode lines 34 may be fabricated using any suitable technique, for example using photolithography with or without pitch-multiplication with respect to a blanket-deposited layer of material of lines 34. Example lateral thickness and elevational thickness for individual capacitor electrode lines 34 are 100 to 1,000 Angstroms and 200 Angstroms to 1 micron, respectively. Capacitor electrode lines 34 are shown as being straight-linear although curved, non-parallel, combination of curved and straight segmented, etc. configurations may be used. For purposes of the continuing discussion, capacitor electrode lines 34 may be considered as comprising laterally-opposing sides 33, 35, a bottom 31, and a top 36. In one embodiment, the forming of pairs of laterally-opposing sides 33, 35 of capacitor electrode lines 34 forms such to be individually straight-linear/linearly straight from top 36 to bottom 31 in horizontal cross-section taken anywhere from top 36 to bottom 31 of capacitor electrode lines 34 (for example as clearly shown in one horizontal cross-section that is FIG. 4). In some embodiments, capacitor electrode lines 34 are referred to as second capacitor electrodes or second capacitor electrode lines.

Figure 5:
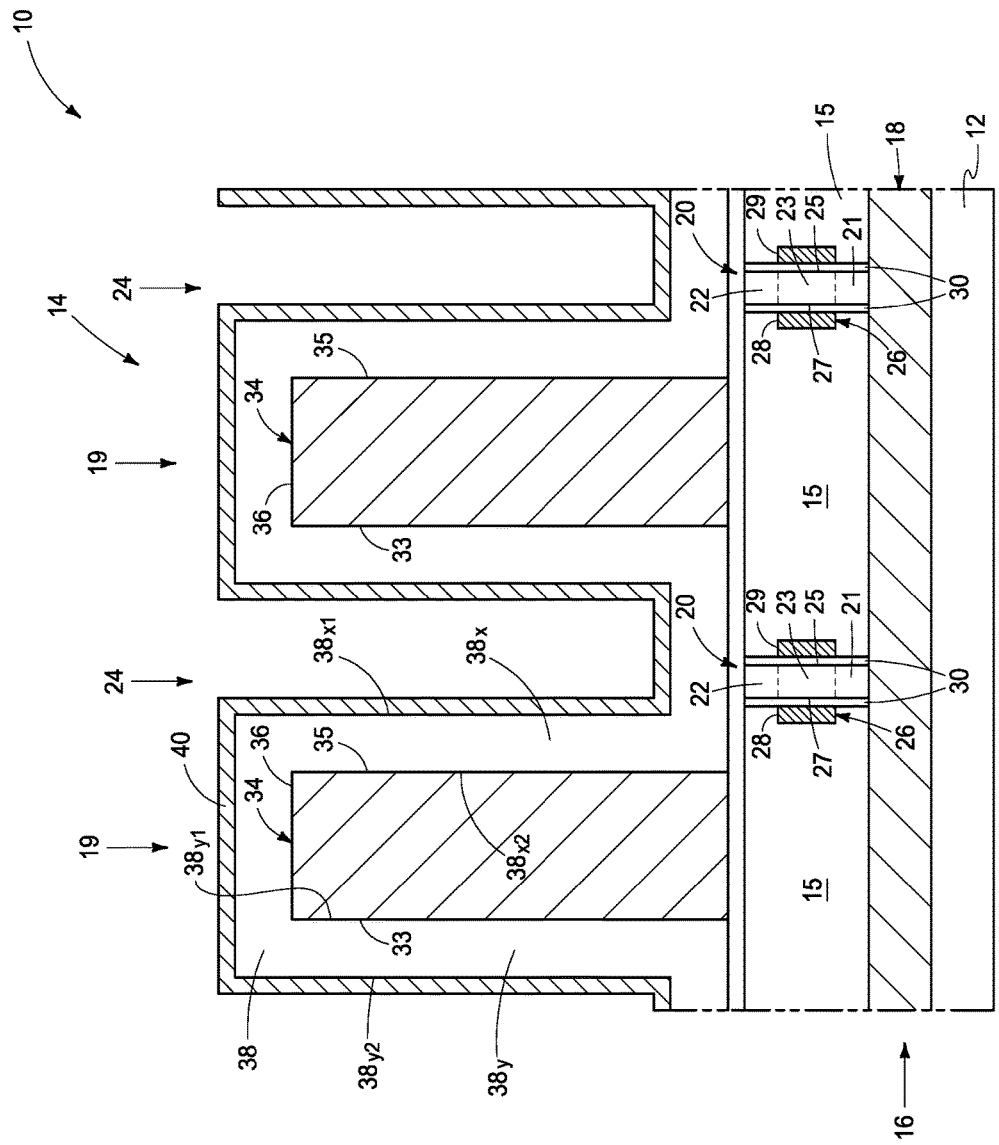
FIG. 5 is a front elevational view of the FIGS. 3 and 4 construction at a processing step subsequent to that shown by FIGS. 3 and 4.

Referring to FIG. 5, a capacitor insulator 38 has been formed over pairs of laterally-opposing sides 33, 35 of and longitudinally along individual capacitor electrode lines 34, and in one embodiment as shown over tops 36 of individual capacitor electrode lines 34. Example capacitor insulator materials include $SiO_2$, $Si_3N_4$, and/or high-k dielectrics and whereby the capacitors are volatile. Alternately in other example embodiments, capacitor insulator 38 comprises programmable material such that the capacitors are formed to be non-volatile and programmable into at least two different magnitude capacitive states (e.g., whereby the programmable material is both sufficiently thick and remains insulative in the different states such that a current sufficient to erase a stored state does not flow there-through at operating voltages). Example such programmable materials include ferroelectric materials, conductive bridging RAM (CBRAM) materials, phase change materials, and resistive RAM (RRAM) materials, with ferroelectrics believed to be ideal. Example ferroelectric material include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. In one embodiment, capacitor insulator 38 comprises dielectric material such that the capacitors are volatile. For example, such can comprise one or more of non-programmable dielectric materials such as silicon dioxide, silicon nitride, aluminum oxide, high-k dielectrics, etc. whereby no charge is retained in material 38 upon removal or sufficient reduction of voltage/potential from one or both of two capacitor electrodes of the capacitor. Non-volatile programmable capacitors may have a capacitor insulator that has a suitable combination of programmable material(s) and non-programmable material(s). Regardless, an example thickness for capacitor insulator 38 is 30 to 100 Angstroms.

For purposes of the continuing discussion, capacitor insulator 38 may be considered as comprising an elevationally-extending first capacitor insulator 38x comprising a pair of laterally-opposing sides 38x1 and 38x2 both of which are laterally over side 35 of capacitor electrode lines 34. Further, capacitor insulator 38 may be considered as comprising elevationally-extending second capacitor insulator 38y comprising a pair of laterally-opposing sides 38y1 and 38y2 both of which are laterally over side 33 of capacitor electrode lines 34.

Conductive material 40 has been formed over capacitor insulator 38 and will ultimately comprise conductive material of the other of the two capacitor electrodes of the individual capacitors being formed. Material 40 may be of the same or different composition as that of the material of capacitor electrode lines 34. An example thickness for material 40 is 25 to 50 Angstroms.

Figure 6:
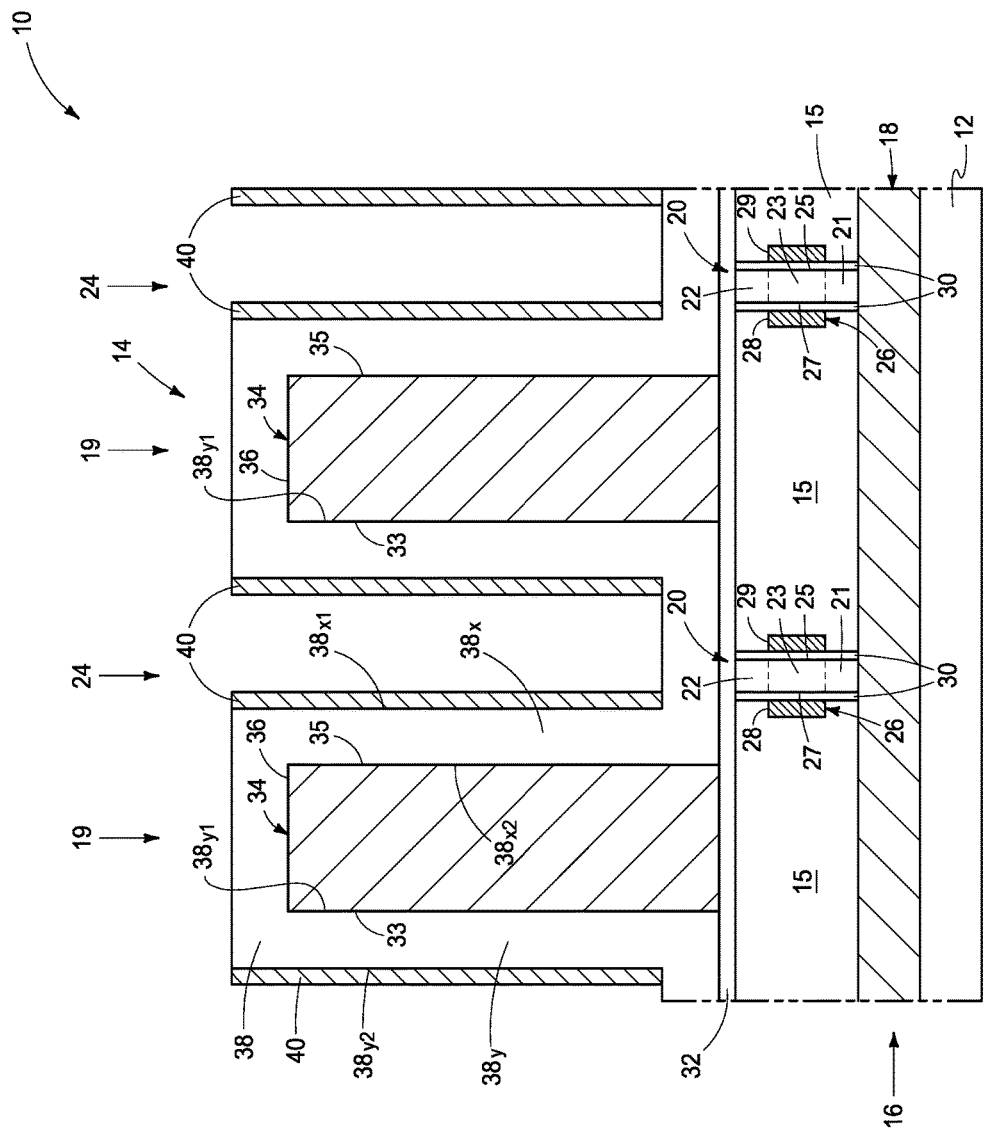
FIG. 6 is a view of the FIG. 5 construction at a processing step subsequent to that shown by FIG. 5.

Referring to FIG. 6, and in one embodiment, maskless anisotropic etching (i.e., maskless at least within all of array 14) has been conducted of conductive material 40 to remove it from being over capacitor electrode line tops 36 and from being interconnected between laterally-adjacent capacitor electrode lines 34.

Figure 7:
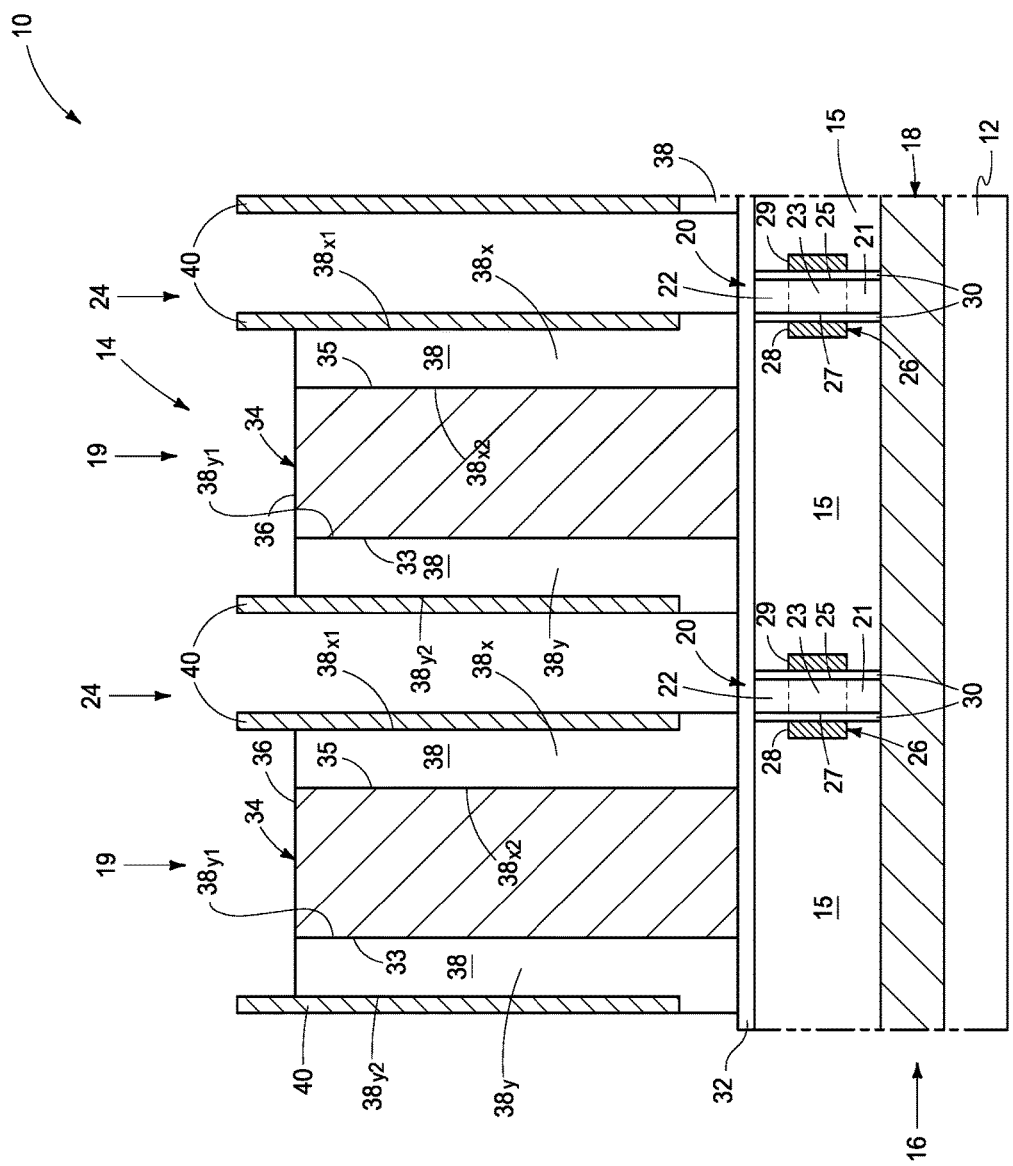
FIG. 7 is a view of the FIG. 6 construction at a processing step subsequent to that shown by FIG. 6.

Referring to FIG. 7, capacitor insulator 38 has been removed back, for example by selective anisotropic etching relative to material 40 and material of capacitor electrode lines 34, at least to tops 36 of capacitor electrode lines 34. In this document, a selective etch or removal is an etch or removal where one material is removed relative to another stated material at a rate of at least 2.0:1.

Figure 8:
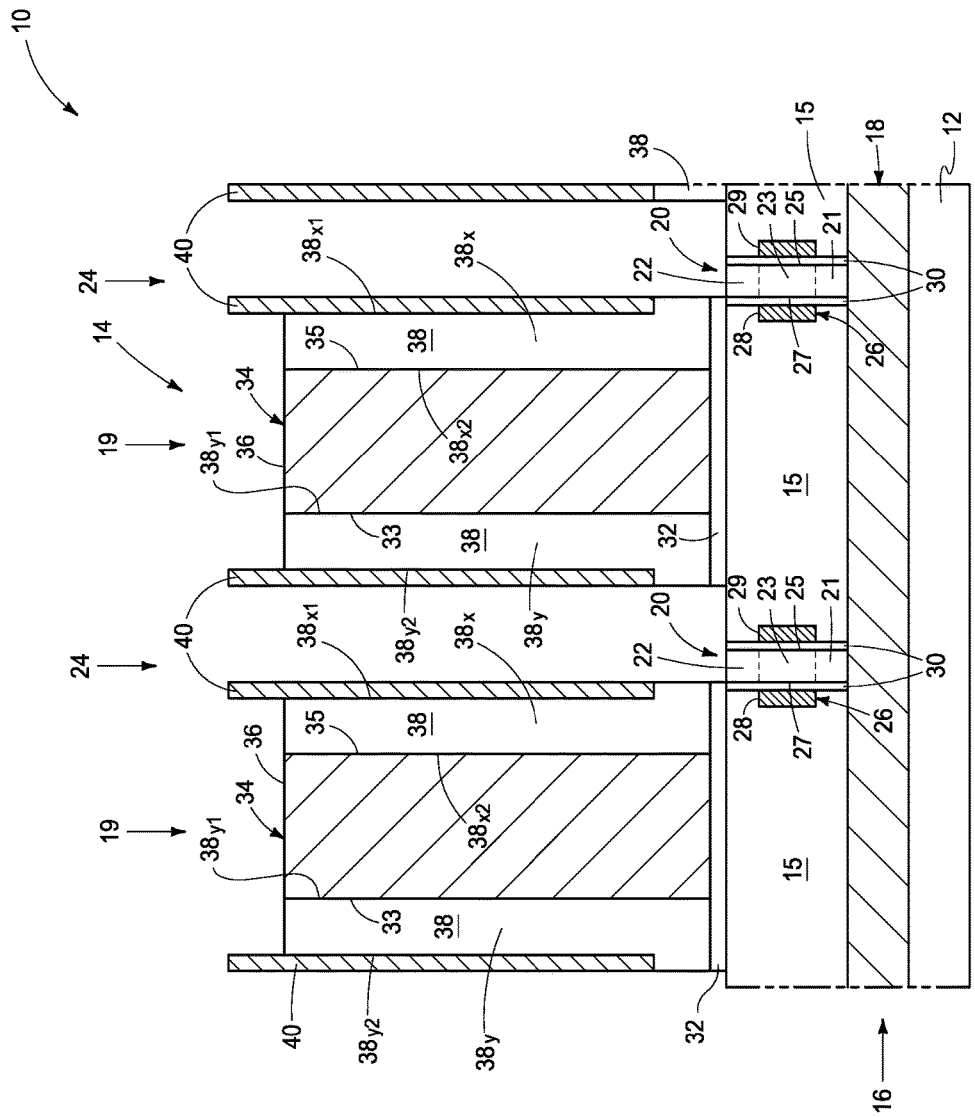
FIG. 8 is a view of the FIG. 7 construction at a processing step subsequent to that shown by FIG. 7.

Referring to FIG. 8, exposed material 32 has been removed (e.g., by maskless [at least within array 14] selective anisotropic etching relative to other exposed materials) to expose upper source/drain regions 22 of individual transistors 20.

Figure 9:
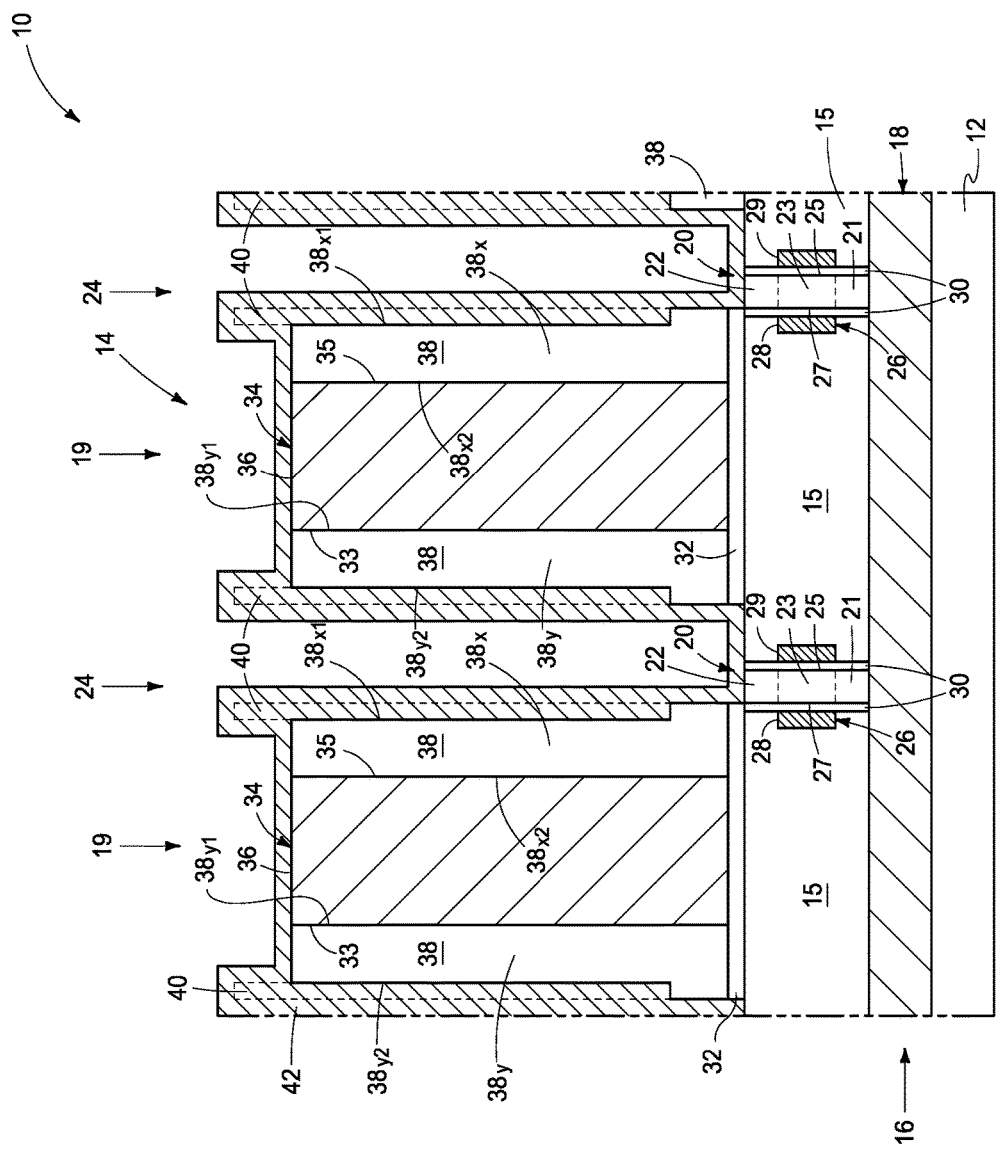
FIG. 9 is a view of the FIG. 8 construction at a processing step subsequent to that shown by FIG. 8.

Referring to FIG. 9, conductive material 42 (which may be of the same or different composition as that of material 40) has been deposited as part of construction 10. In one embodiment and as shown, such has been deposited to the same thickness as conductive material 40, and in one embodiment is of the same composition as conductive material 40 as shown by the dashed interface lines between materials 40 and 42.

Figure 10:
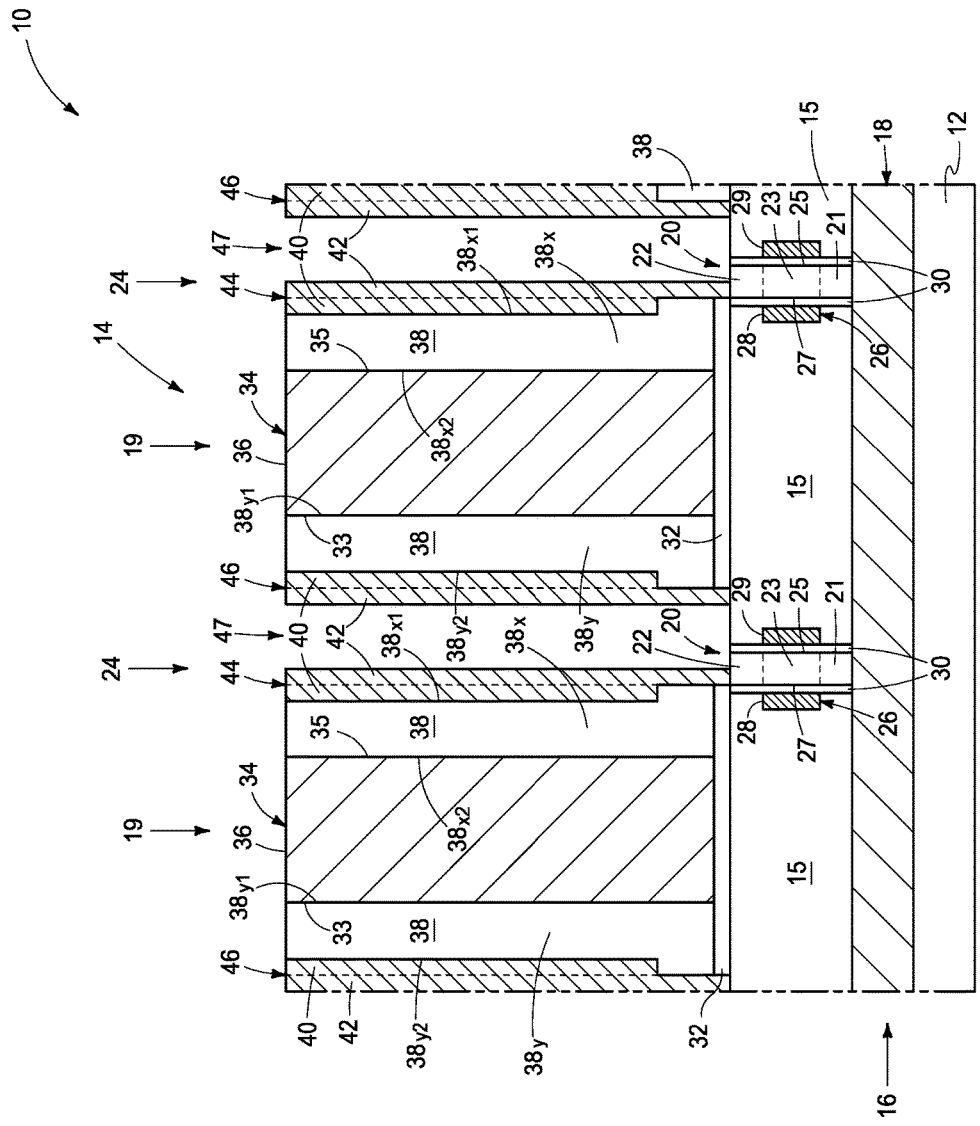
FIG. 10 is a view of the FIG. 9 construction at a processing step subsequent to that shown by FIG. 9, and is taken through line 10-10 in FIG. 11.
Figure 11:
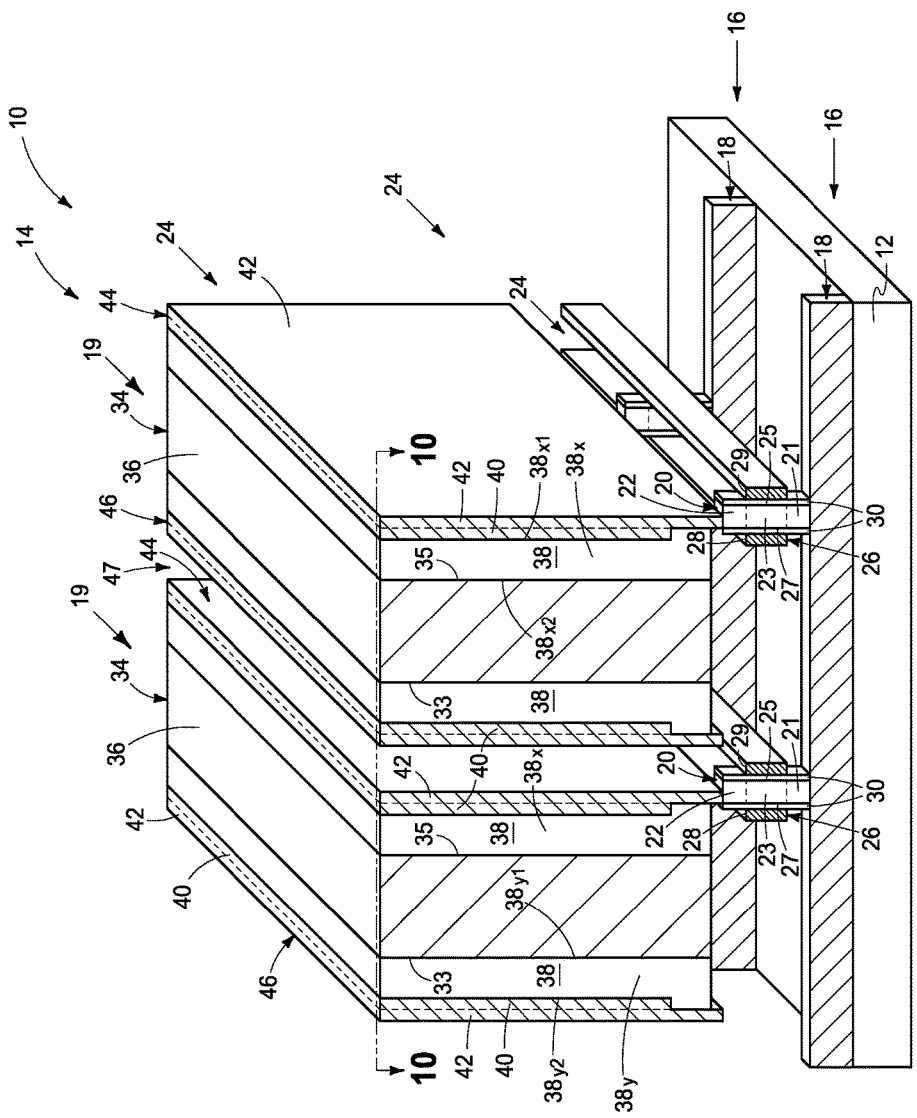
FIG. 11 is a perspective view of the FIG. 10 construction.

Referring to FIGS. 10 and 11 and in one embodiment, conductive materials 40 and 42 have been maskless anisotropically etched (i.e., maskless at least within all of array 14) to remove such from being over tops 36 of capacitor electrode lines 34 and to remove material 42 from being interconnected between laterally-adjacent conductive capacitor lines 34. Such forms an elevationally-extending conductive line (e.g., 44) over capacitor insulator 38 longitudinally along one of laterally-opposing sides 33 and 35 (e.g., side 35 for line 44) of individual capacitor electrode lines 34 longitudinally along individual transistor lines 24. Individual conductive lines 44 are electrically coupled (in one embodiment directly electrically coupled) to upper source/drain regions 22 of individual transistors 20 longitudinally along that line 24 of transistors 20. In one embodiment and as shown, the processing going from FIG. 9 to FIGS. 10 and 11 has formed another elevationally-extending conductive line 46 over capacitor insulator 38 longitudinally along laterally-opposing side 33 of individual capacitor electrode lines 34. A trench 47 is shown between immediately-adjacent conductive lines 44 and 46.

Figure 12:
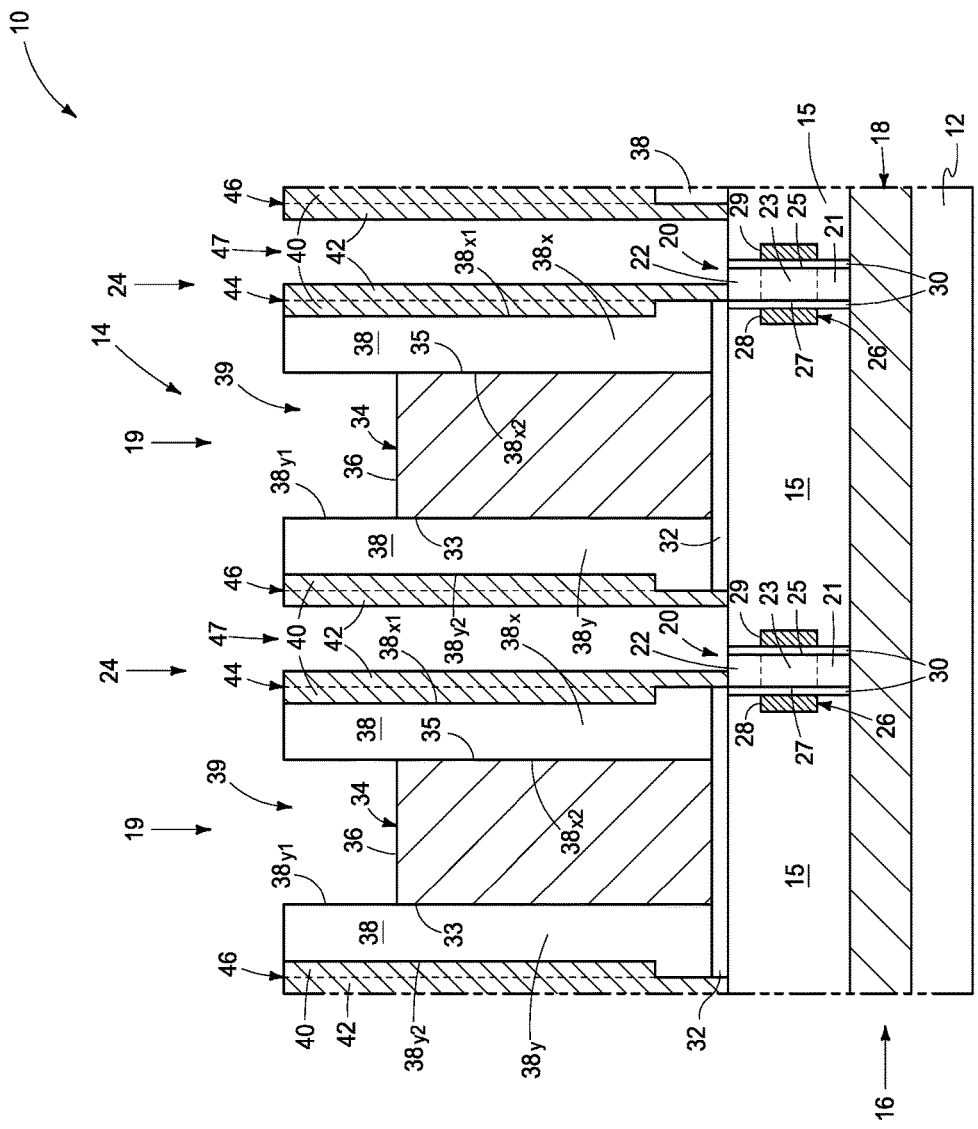
FIG. 12 is a front elevational view of the FIGS. 10 and 11 construction at a processing step subsequent to that shown by FIGS. 10 and 11.

Referring to FIG. 12, material of capacitor electrode lines 34 has been removed back, for example by selective etching relative to other exposed materials as shown, forming void spaces 39 above capacitor electrode lines 34.

Figure 13:
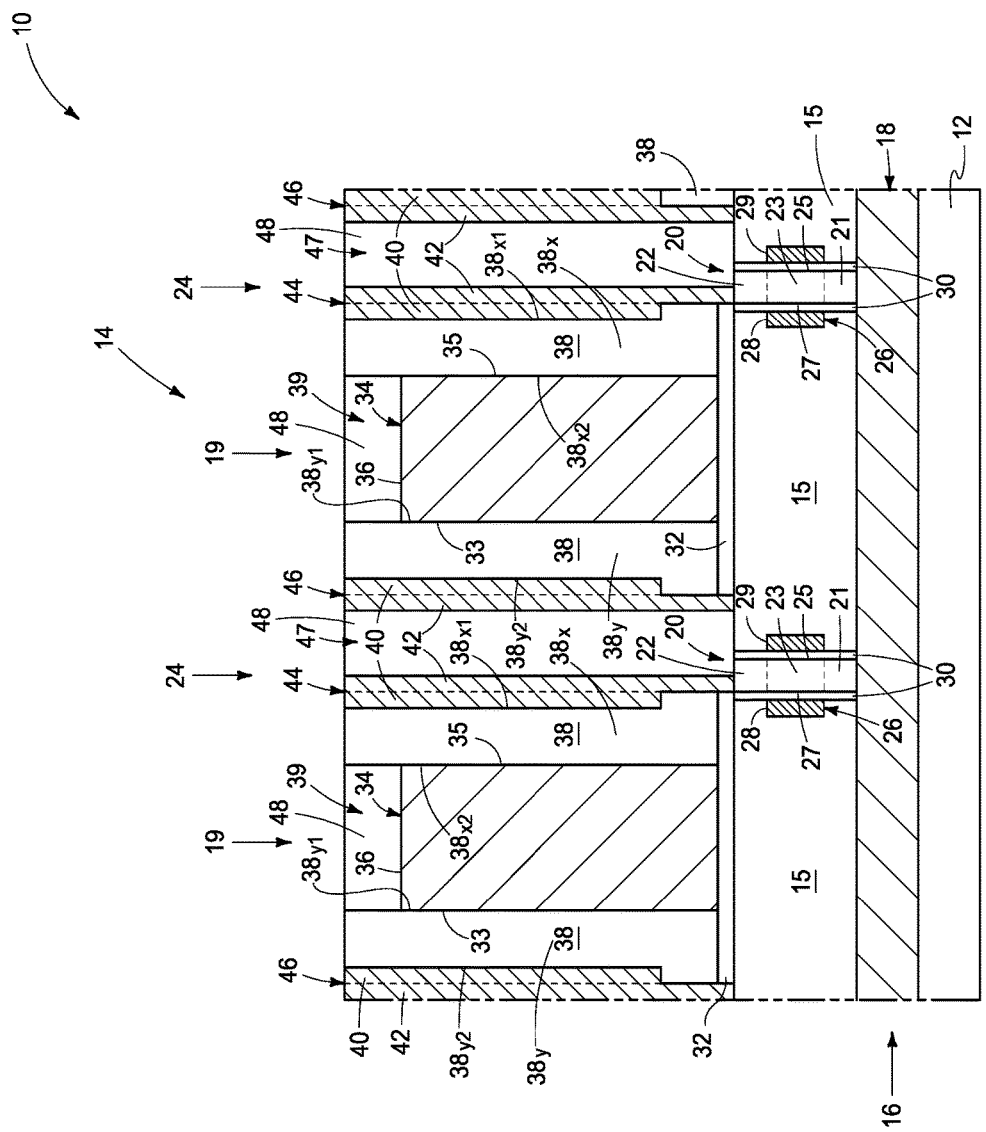
FIG. 13 is a view of the FIG. 12 construction at a processing step subsequent to that shown by FIG. 12, and is taken through line 13-13 in FIG. 14.
Figure 14:
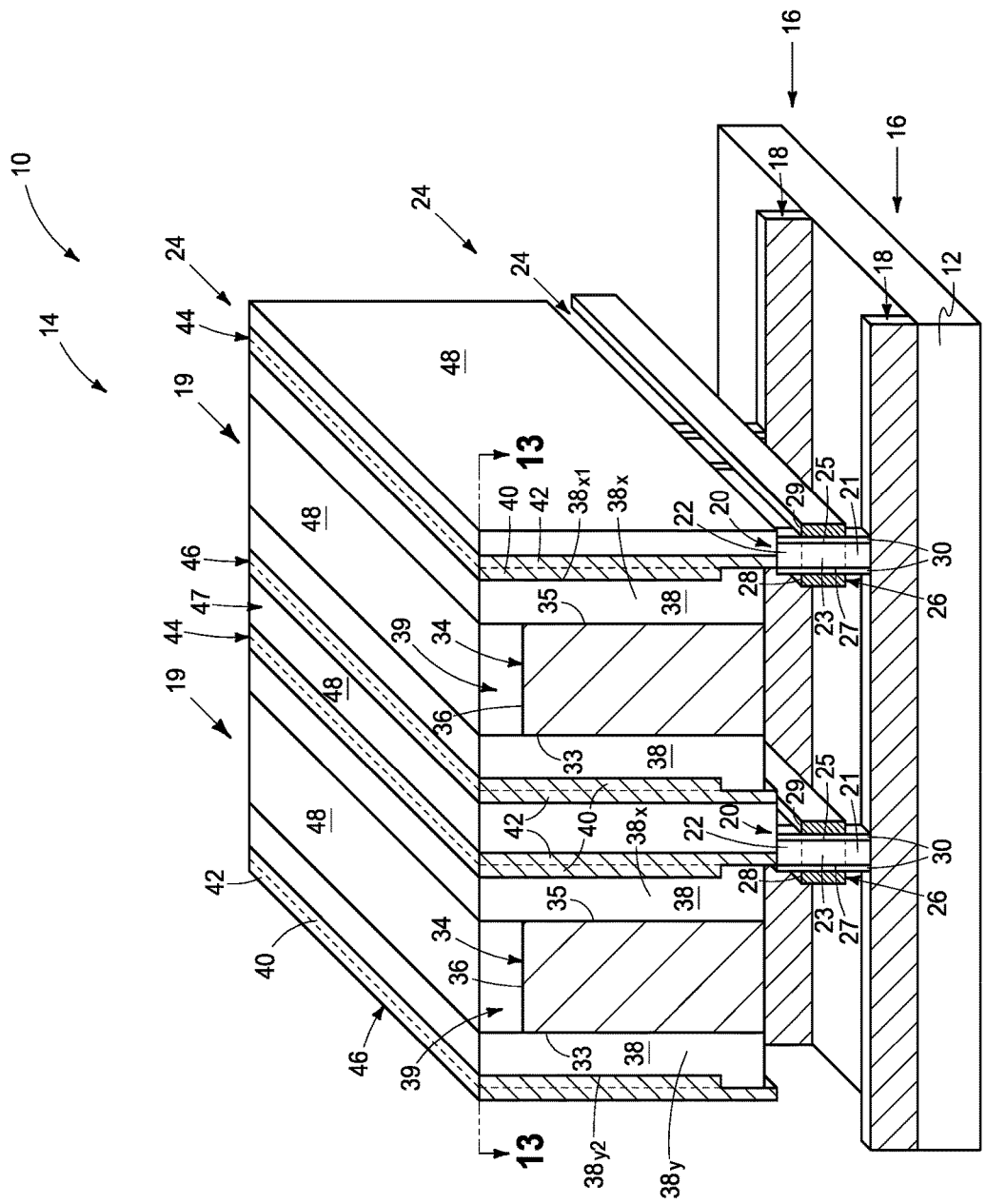
FIG. 14 is a perspective view of the FIG. 13 construction.

Referring to FIGS. 13 and 14, trenches 47 and void spaces 39 have been filled and over-filled with insulator material 48, followed by planarizing such back (e.g., by CMP) along with capacitor insulator 38 and lines 44, 46 to produce the depicted construction. Any suitable insulator material 48 may be used and which may be of the same or different composition as that of capacitor insulator 38, with such being shown to be of different composition from that of capacitor insulator 38 by the solid interface lines therebetween.

Figure 15:
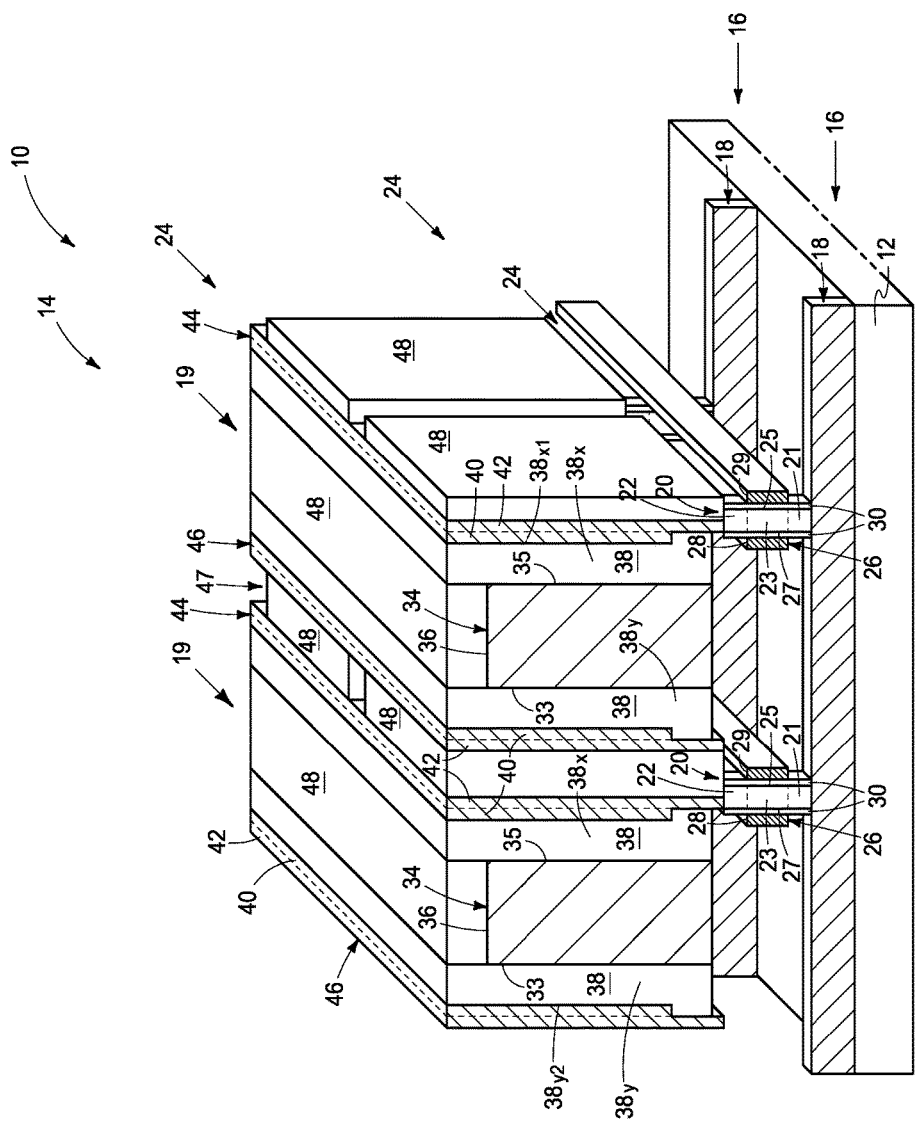
FIG. 15 is a view of the FIG. 14 construction at a processing step subsequent to that shown by FIGS. 13 and 14.

Referring to FIG. 15, insulator material 48 has been patterned (e.g., using photolithography with or without pitch multiplication) to expose portions of laterally-outermost sides of conductive lines 44, 46, as shown.

Figure 16:
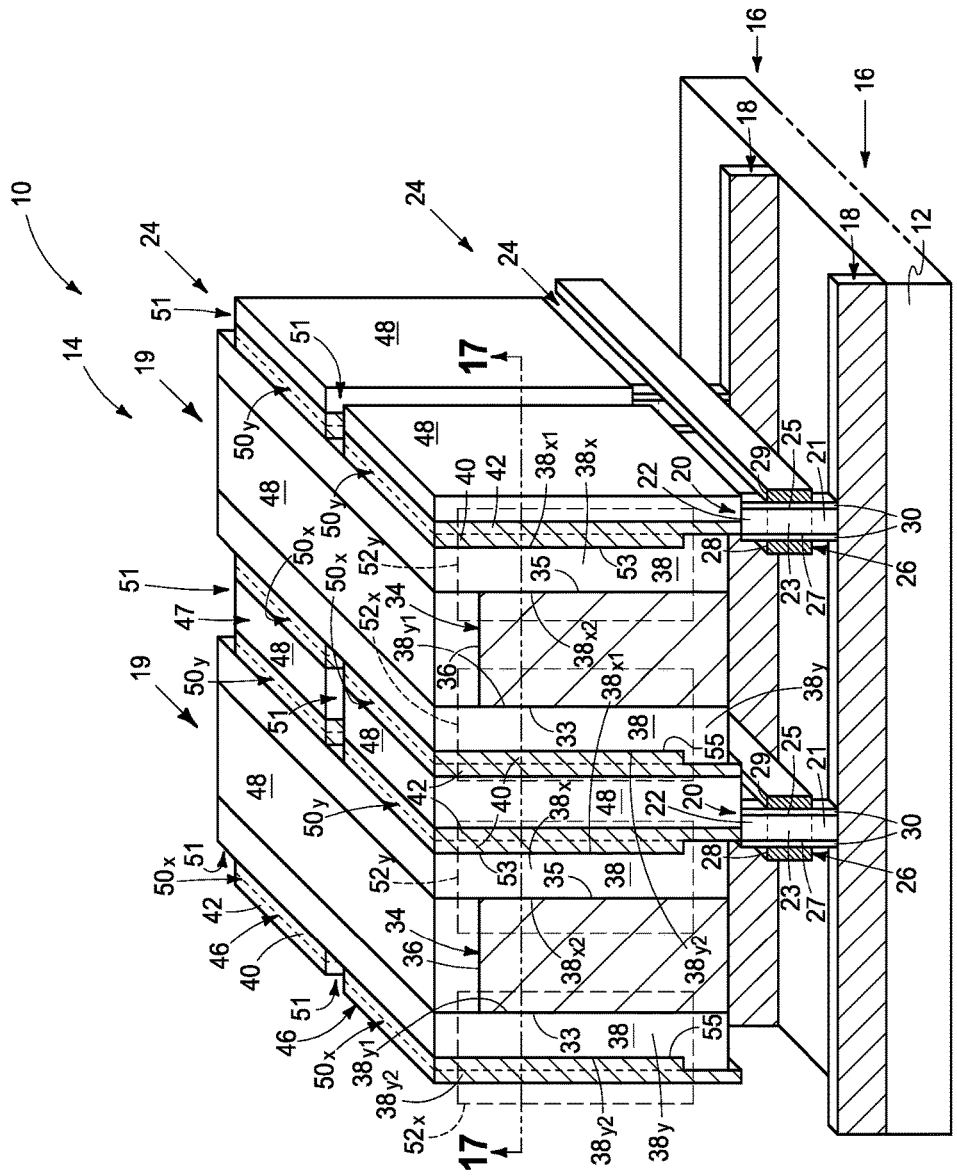
FIG. 16 is a view of the FIG. 15 construction at a processing step subsequent to that shown by FIG. 15.
Figure 17A:
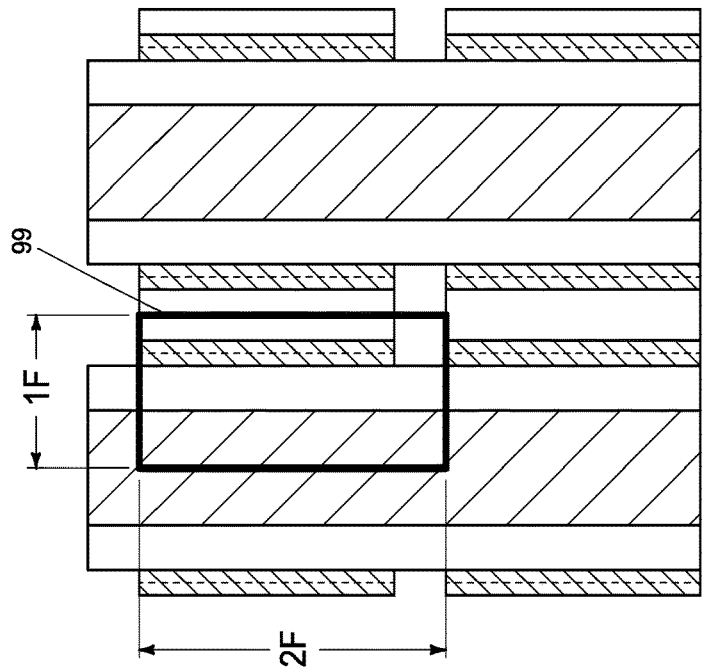
FIG. 17A corresponds to and is of the same construction as shown in FIG. 17.
Figure 17:
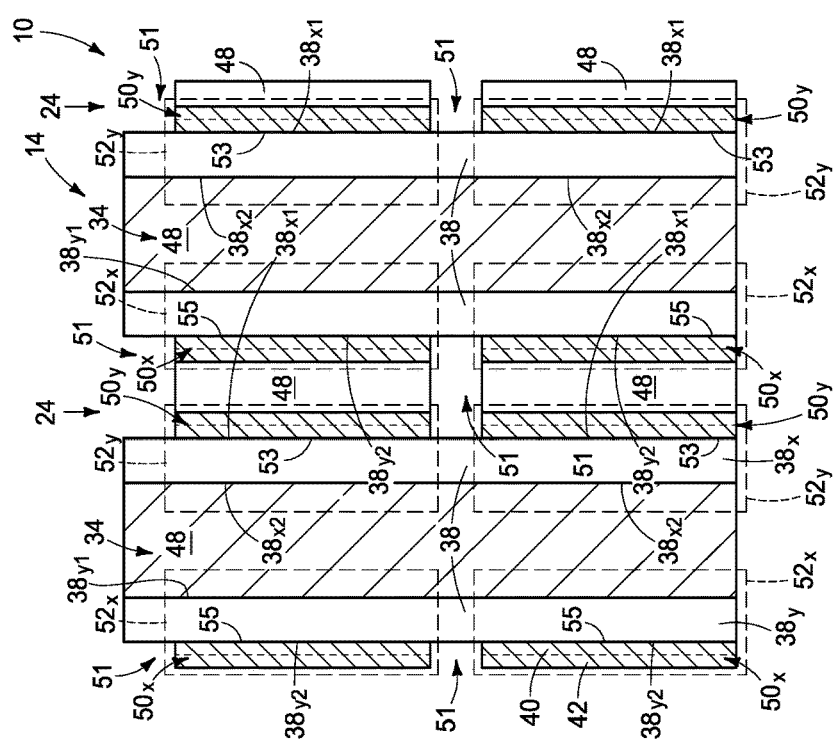
FIG. 17 is a cross-sectional view taken through line 17-17 in FIG. 16.

Referring to FIGS. 16 and 17, conductive lines 44 and conductive lines 46 (neither of which is numerically designated in FIGS. 16, 17) of FIG. 15 have been cut laterally through to form spaced individual other electrodes (e.g., 50x or 50y) of the two capacitor electrodes of individual capacitors (e.g., 52x or 52y, respectively). Such cutting may be conducted, by way of example, by selective wet or dry isotropic or anisotropic etching of materials 40 and 42 relative to other exposed material. The act of cutting may result in elevational and/or longitudinal recessing (neither being shown) of materials 40 and/or 42 relative to one or more of materials 38 and 48. For purposes of the continuing discussion, capacitor electrodes 50y may be considered as having a lateral side 53 and capacitor electrodes 50x may be considered as having a lateral side 55. In some embodiments, either of capacitor electrode 50x and 50y may be considered as a first capacitor electrode. In some embodiments, capacitor electrode 50y may be considered as a first capacitor electrode and capacitor electrode 50x may be considered as a third capacitor electrode.

FIG. 17 designates four pairs (FIG. 16 only two) of capacitors 52x, 52y, with each pair sharing a single/common capacitor electrode in the form of one of shared capacitor electrode lines 34. Multiple additional such pairs of capacitors would be longitudinally spaced from one another along capacitor electrode lines 34, for example by a depicted space 51 that is between immediately-longitudinally-adjacent of capacitor electrodes 50x and of capacitor electrodes 50y along conductive lines 34. In one embodiment and as shown, electrodes 50x, 50y are formed to individually extend longitudinally along their respective capacitor electrode line 34 a greater horizontal distance than horizontal distance of space 51 between immediately-longitudinally-adjacent capacitor electrodes 50x and/or 50y.

In one embodiment, other capacitor electrode 50x and/or 50y is formed to individually, from top to bottom, be laterally-thinnest at the bottom, for example as shown. In one embodiment, other capacitor electrode 50x and/or 50y is formed to be, from side-to-side, entirely solid from top to bottom in horizontal cross-section (i.e., such includes no hollow central or other hollow portion and/or are not of a container-like shape), for example as shown. In one embodiment, individual of other capacitor electrodes 50y are formed to be directly against an uppermost surface of individual upper source/drain regions 22 of individual transistors 20. In one such embodiment, individual other capacitor electrodes 50y are directly against less than all (FIG. 16), and in one embodiment no more than half of all (half being shown), of the respective uppermost surface of upper source/drain regions 22.

In one embodiment, the forming of the elevationally-extending conductive line over the capacitor insulator longitudinally along one of the laterally-opposing sides of the individual capacitor electrode lines comprises etching conductive material (e.g., 40 and/or 42) of the conductive line without any mask being atop the substrate within the array and prior to the act of cutting. In one embodiment, the forming of the elevationally-extending conductive line over the capacitor insulator longitudinally along one of the laterally-opposing sides of the individual capacitor electrode lines comprises two time-spaced depositions of conductive material of the conductive line (i.e., material 40 in FIG. 5 and material 42 in FIG. 9) prior to the cutting. In one such embodiment, between the two time-spaced depositions, etching is conducted of the conductive material (e.g., of material 40 in FIG. 6), and after the second of the two time-spaced depositions, the conductive material is etched (e.g., material 42 in FIG. 10) prior to the cutting. In one such embodiment, each of the etchings is conducted without any mask being atop the substrate within the array.

In one embodiment, at least a majority (in one embodiment all) of the one laterally-opposing side (e.g., 38x1) of the first capacitor insulator (e.g., 38x) and the lateral side (e.g., 55) of the first capacitor electrode (e.g., 50x) from top to bottom where such are directly against one another are each linearly straight in horizontal cross-section. In one embodiment, at least a majority (in one embodiment all) of the other laterally-opposing side (e.g., 38x2) of the first capacitor insulator and the one laterally opposing side (e.g., 35) of the second capacitor electrode (e.g., 34) from top to bottom where such are directly against one another are each linearly straight in horizontal cross-section. In one embodiment, at least a majority (in one embodiment all) of the one laterally-opposing side (e.g., 38y1) of the second capacitor insulator (e.g., 38y) and the other laterally opposing side (e.g., 33) of the second capacitor electrode from top to bottom where such are directly against one another are each linearly straight in horizontal cross-section. In one embodiment, at least a majority (in one embodiment all) of the other laterally-opposing side (e.g., 38y2) of the second capacitor insulator and the lateral side (e.g., 55) of the third capacitor electrode (e.g., 50x) from top to bottom where such are directly against one another are each linearly straight in horizontal cross-section.

In one embodiment, the other laterally-opposing side (e.g., 38x2) of the capacitor insulator (e.g., 38x) extends longitudinally along and directly against the one laterally-opposing side (e.g., 35) of the respective second capacitor electrode lines (e.g., 35) between immediately-longitudinally-adjacent capacitors (e.g., 50y) along individual lines (e.g., 19) of capacitors.

Figure 18:
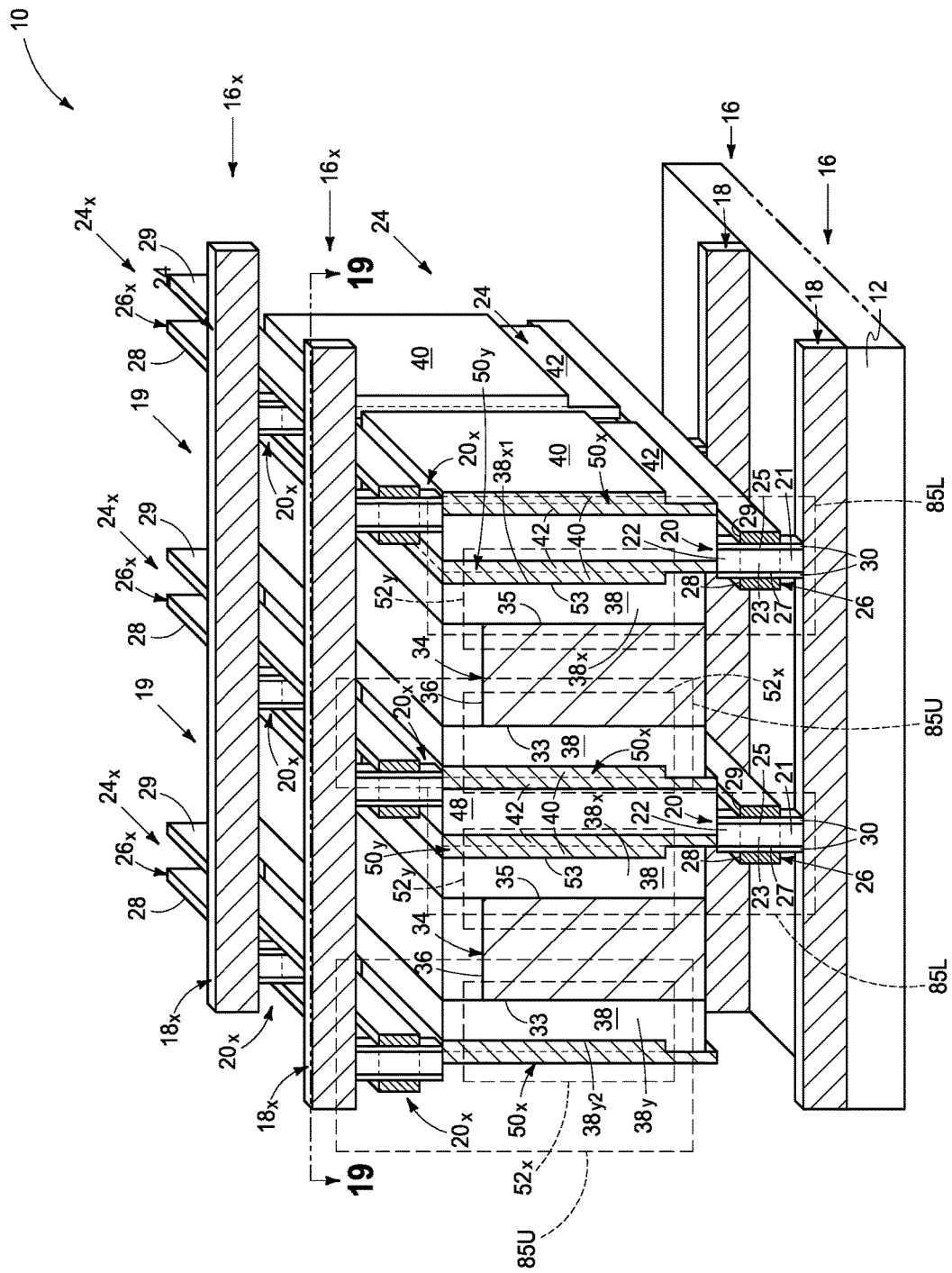
FIG. 18 is a view of the FIG. 16 construction at a processing step subsequent to that shown by FIGS. 16, 17, and 17A.
Figure 19:
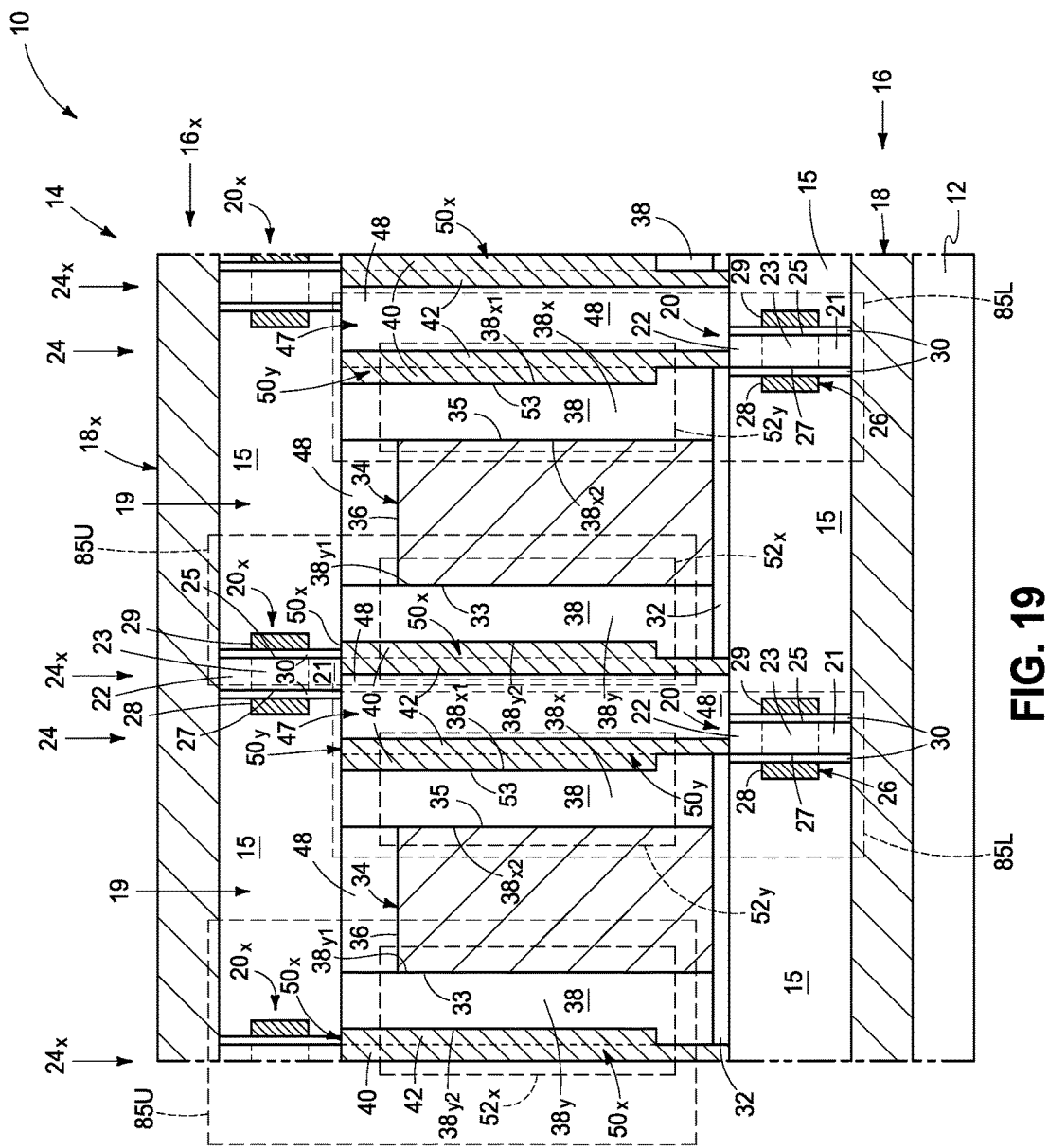
FIG. 19 is a front elevational view of the FIG. 18 construction taken through line 19-19 in FIG. 18.

FIGS. 18 and 19 depict, in one embodiment, subsequent processing having been conducted. Specifically, elevationally-extending upper transistors 20x have been formed over individual of other electrodes 50x of individual capacitors 52x on other laterally-opposing sides 33 of individual capacitor electrode lines 34. Individual of other capacitor electrodes 50x are electrically coupled (in one embodiment directly electrically coupled) to lower source/drain regions 21 of individual upper transistors 20x longitudinally along a line 24x of upper transistors 20x. In one embodiment and as shown, upper transistors 20x comprise upper rows of upper access lines 26x above other capacitor electrodes 50x of individual capacitors 52x on laterally-opposing side 33 of individual capacitor electrode lines 34. Individual of upper access lines 26 extend laterally across and operatively laterally adjacent a lateral side of upper transistor channels 23 of transistors 20x and interconnect upper transistors 20x in that upper row 24x.

Upper columns 16x of upper data/sense lines 18x have been formed above channels 23 of upper transistors 20x. Individual of upper source/drain regions 22 of upper transistors 20x are electrically coupled (in one embodiment directly electrically coupled) to one of upper data/sense lines 18x, with the one data/sense line 18x interconnecting upper transistors 20x in that upper column 16x. Upper memory cells 85U and lower memory cells 85L have been formed. Only eight complete total of such memory cells (only four being designated with numerals in FIG. 19) are in the depicted construction 10, with again more likely hundreds of thousands, millions, etc. memory cells 85U/85L being formed within array 14.

In one embodiment and as shown in FIGS. 18 and 19, access lines 26 (and in one embodiment lines 26x) are parallel relative one another as are second capacitor electrode lines 34, with lines 34 also being parallel relative access lines 26 (and in one embodiment also being parallel relative lines 26x). In one embodiment and as shown, data/sense lines 18 (and in one embodiment data/sense lines 18x) are parallel relative one another as are second capacitor electrode lines 34, yet with lines 34 not being parallel relative data/sense lines 18 (and in one embodiment with lines 34 also not being parallel relative lines 18x). Dielectric material 15 may be formed, and is not shown in FIG. 18 for clarity therein.

Any other attribute(s) or aspect(s) as described herein and/or shown may be used in the embodiments described above with reference to FIGS. 1-19.

Figure 20:
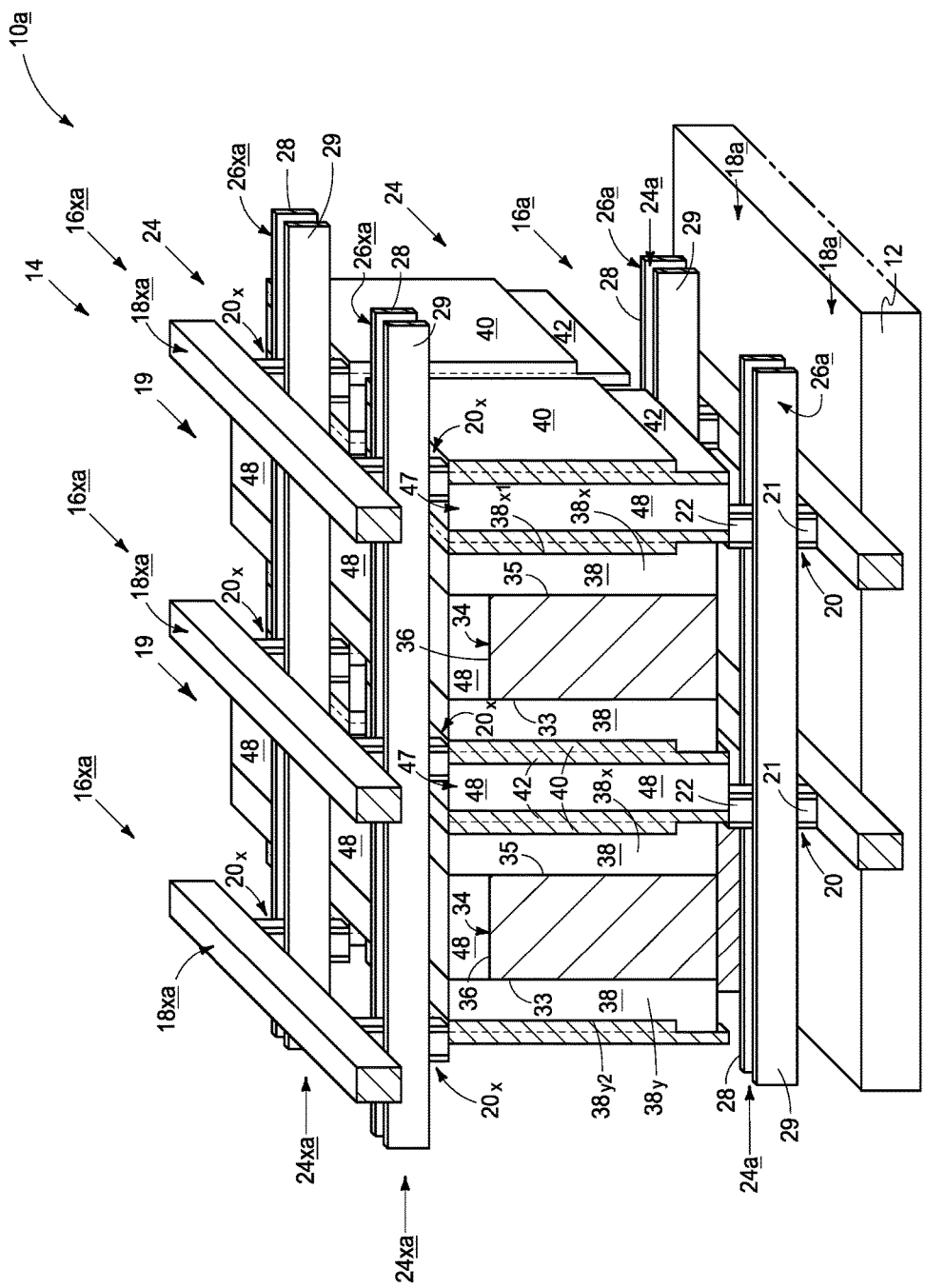
FIG. 20 is a diagrammatic perspective view of a substrate construction in accordance with an embodiment of the invention.

FIG. 20 shows an alternate embodiment construction 10a in comparison to that of FIG. 18. Like numerals from the above-described embodiments have been used where appropriate, with some construction differences being indicated with the suffix "a". FIG. 20 shows an example embodiment where parallel access lines 26a (and in one embodiment access lines 26xa) and not parallel relative second capacitor electrode lines 34. FIG. 20 also shows an example embodiment where parallel data/sense lines 18a (and in one embodiment data/sense lines 18xa) are parallel relative second capacitor electrode lines 34. Any other attribute(s) or aspect(s) as described herein and/or shown may be used.

Additional embodiment methods of forming an array of memory cells individually comprising a capacitor and a transistor are next described with reference to FIGS. 21-30 and a construction 10b. Like numerals from the above-described embodiments have been used where appropriate, with some construction differences being indicated with the suffix "b" or with different numerals.

Figure 21:
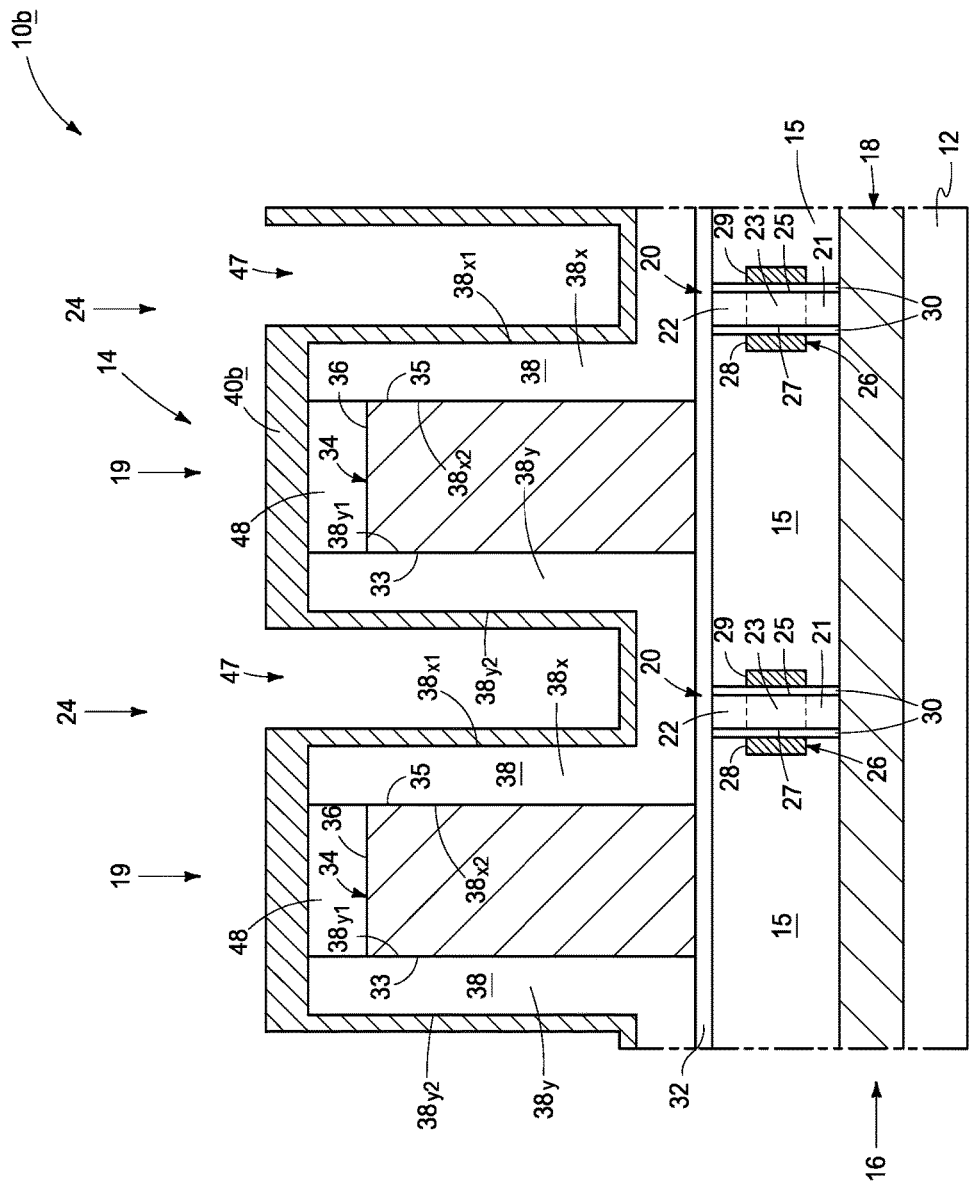
FIG. 21 is a diagrammatic front elevational view of a substrate construction in process in accordance with an embodiment of the invention.

Referring to FIG. 21, alternate processing to that depicted by FIG. 5 is shown. Conductive material 40b has been deposited in a manner whereby such is thicker atop capacitor electrodes lines 34 than it is both between such lines and laterally over side surfaces of capacitor insulator 38. Such may be achieved by conducting deposition of material 40b by physical vapor deposition or by a combination of chemical vapor deposition and physical vapor deposition.

Figure 22:
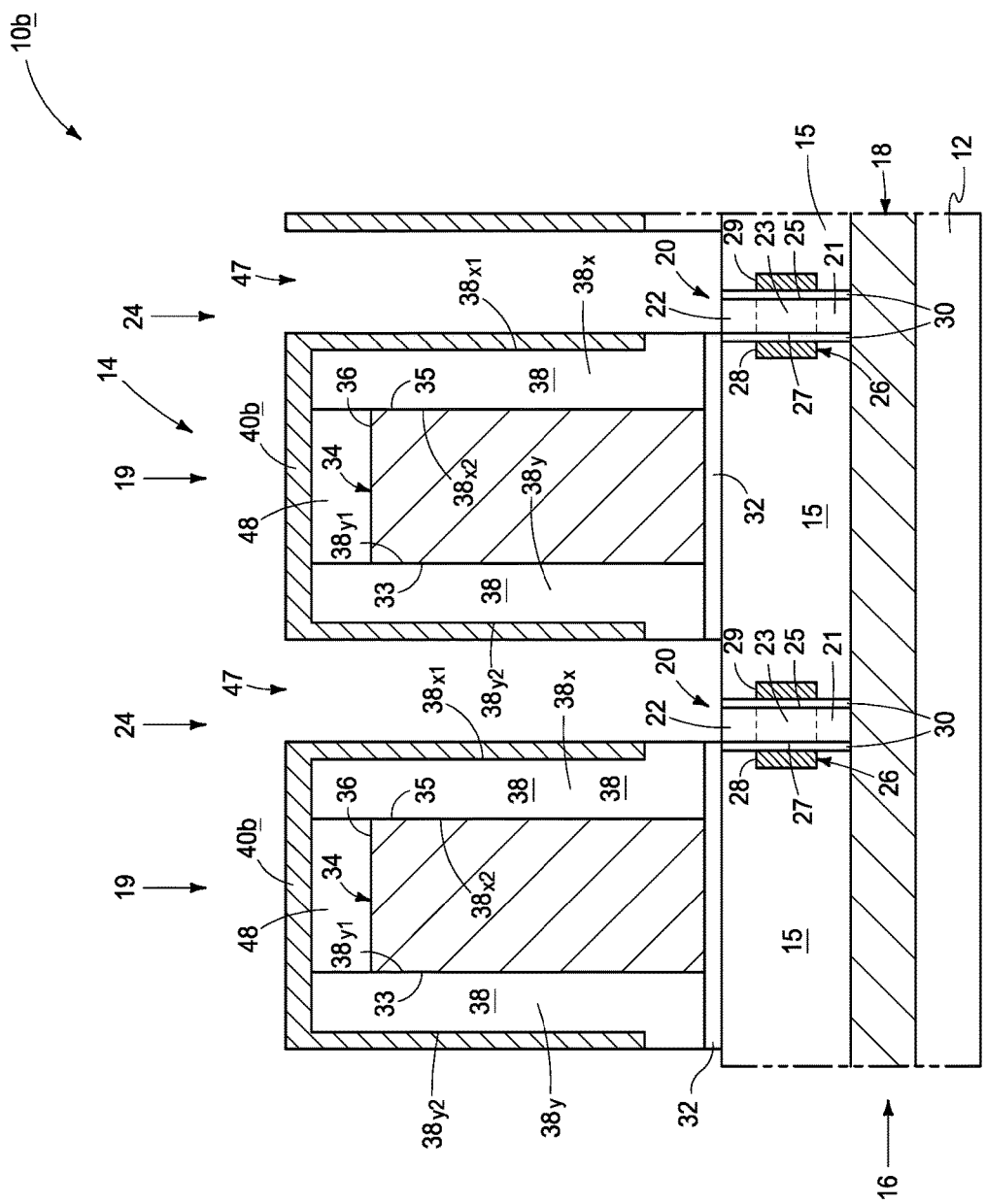
FIG. 22 is a view of the FIG. 21 construction at a processing step subsequent to that shown by FIG. 21.

Referring to FIG. 22, alternate processing is shown in comparison to that depicted by FIGS. 6-8 in the above-described embodiments. Specifically, material 40b, capacitor insulator 38, and material 32 have been removed whereby conductive material 40b remains spanning across a top of capacitor insulator 38. An example removal technique is dry anisotropic etching using one or more etching chemistries, and which in one embodiment is conducted without any mask being atop the substrate within the array.

Figure 23:
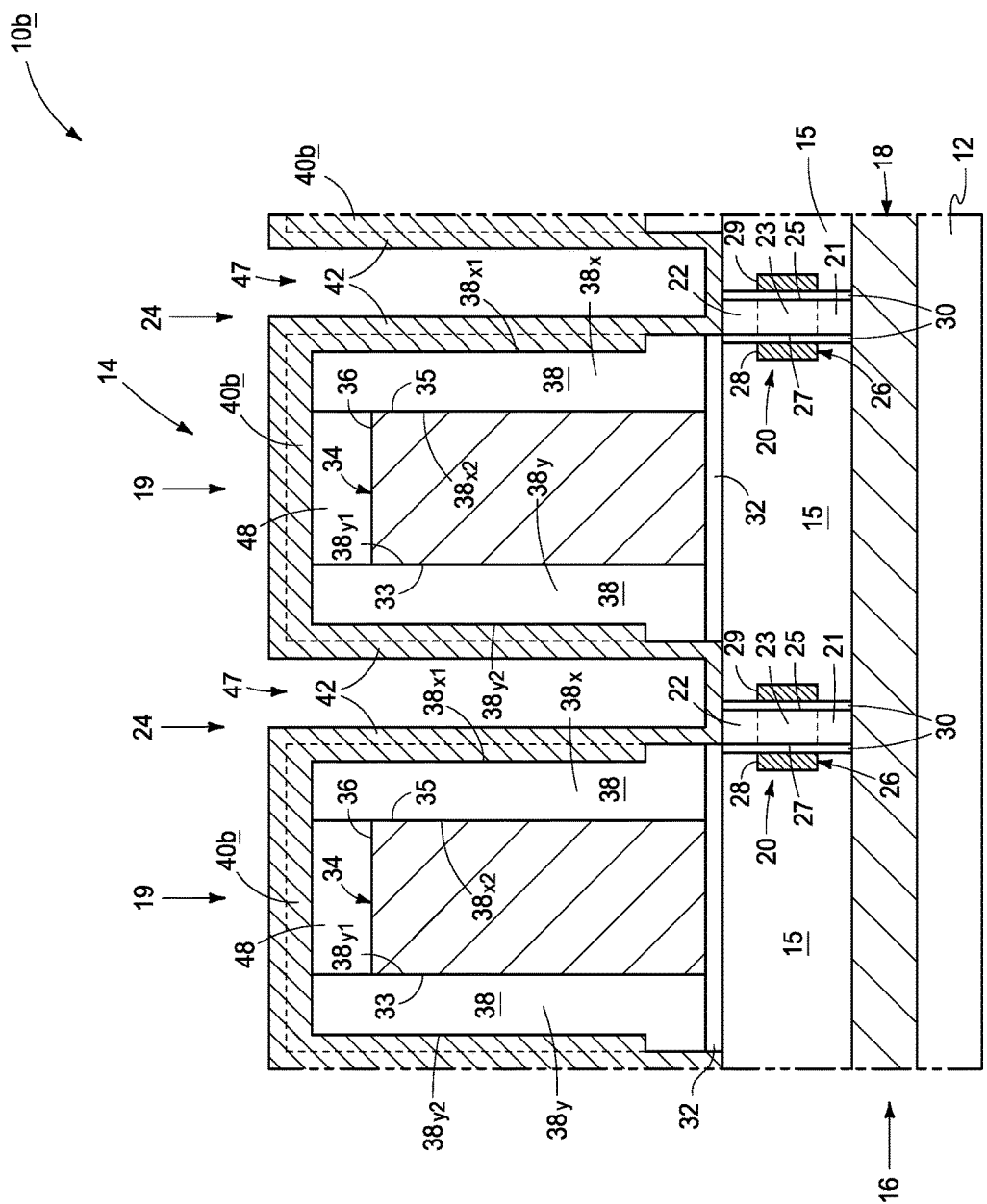
FIG. 23 is a view of the FIG. 22 construction at a processing step subsequent to that shown by FIG. 22.

Referring to FIG. 23, conductive material 42 has been deposited.

Figure 24:
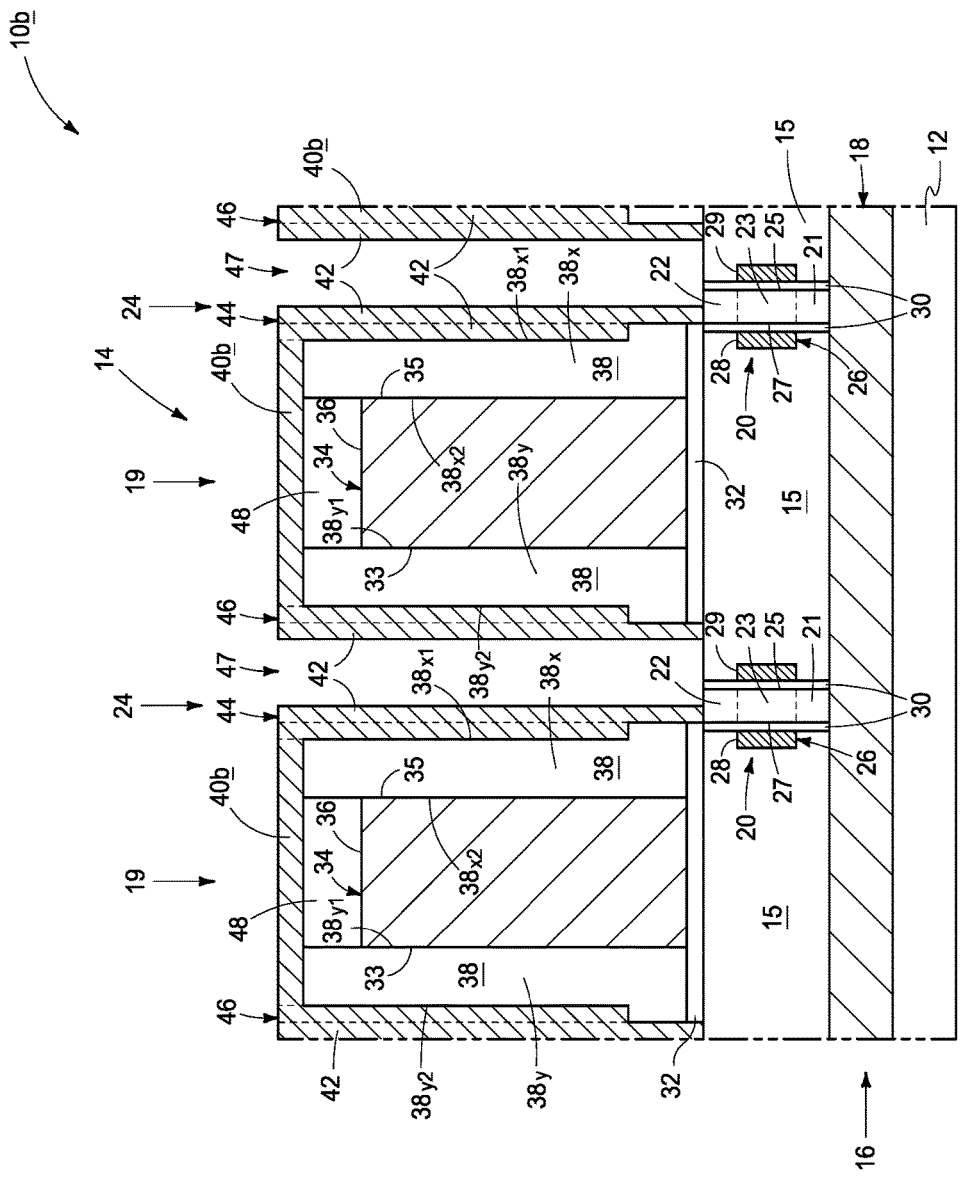
FIG. 24 is a view of the FIG. 23 construction at a processing step subsequent to that shown by FIG. 23, and is taken through line 24-24 in FIG. 25.
Figure 25:
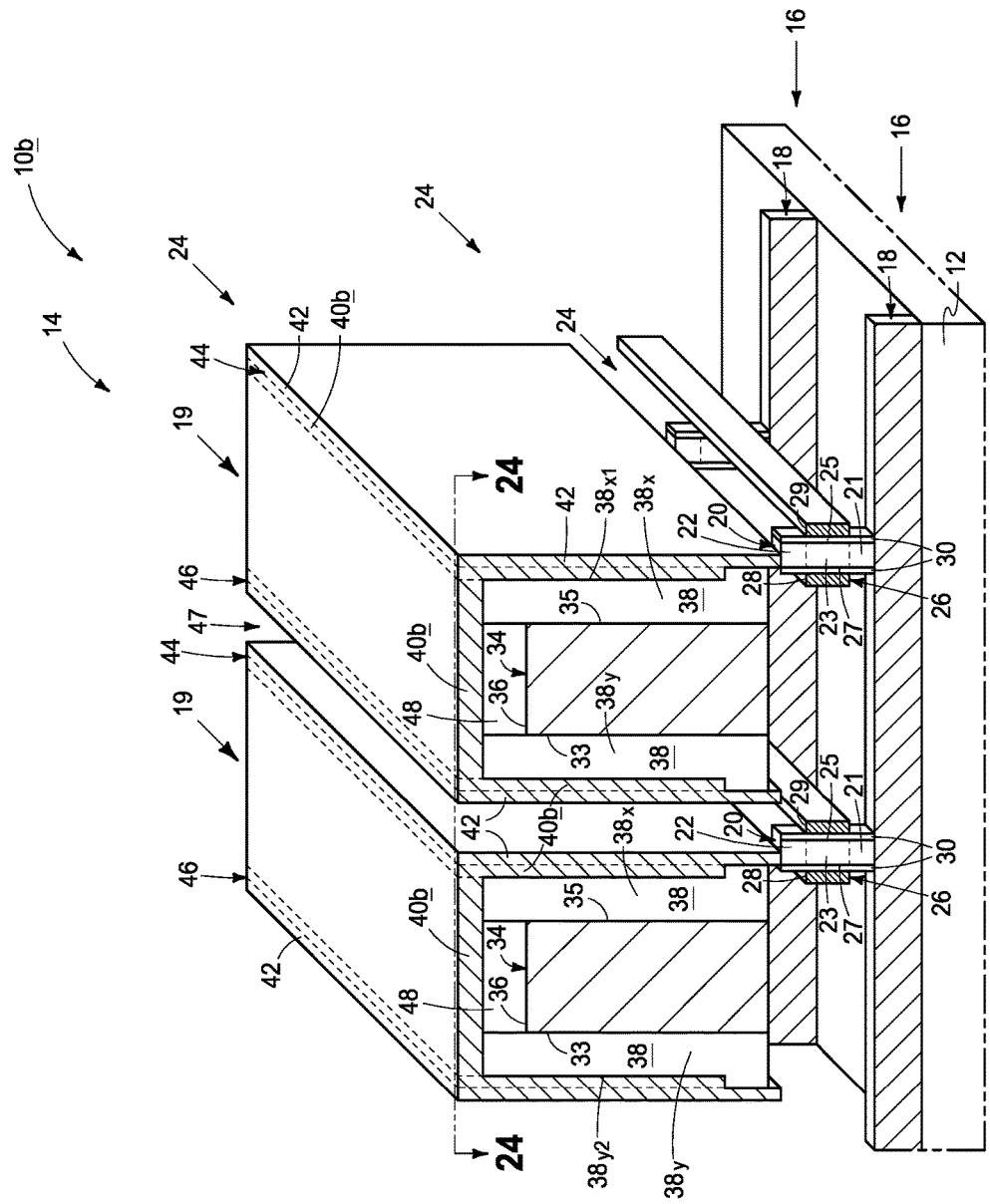
FIG. 25 is a perspective view of the FIG. 24 construction.

Referring to FIGS. 24 and 25, material 42 has been anisotropically etched back as shown (e.g., without any mask being atop the substrate within the array in one embodiment). Such has effectively formed elevationally-extending conductive lines 44 and 46, with laterally-extending conductive material 40b atop capacitor insulator 38 being over tops 36 of individual capacitor electrode lines 34 and which directly electrically couples together conductive lines 44 and 46 that are along each of pair of laterally-opposing sides 33, 35 of individual capacitor electrode lines 34.

Figure 26:
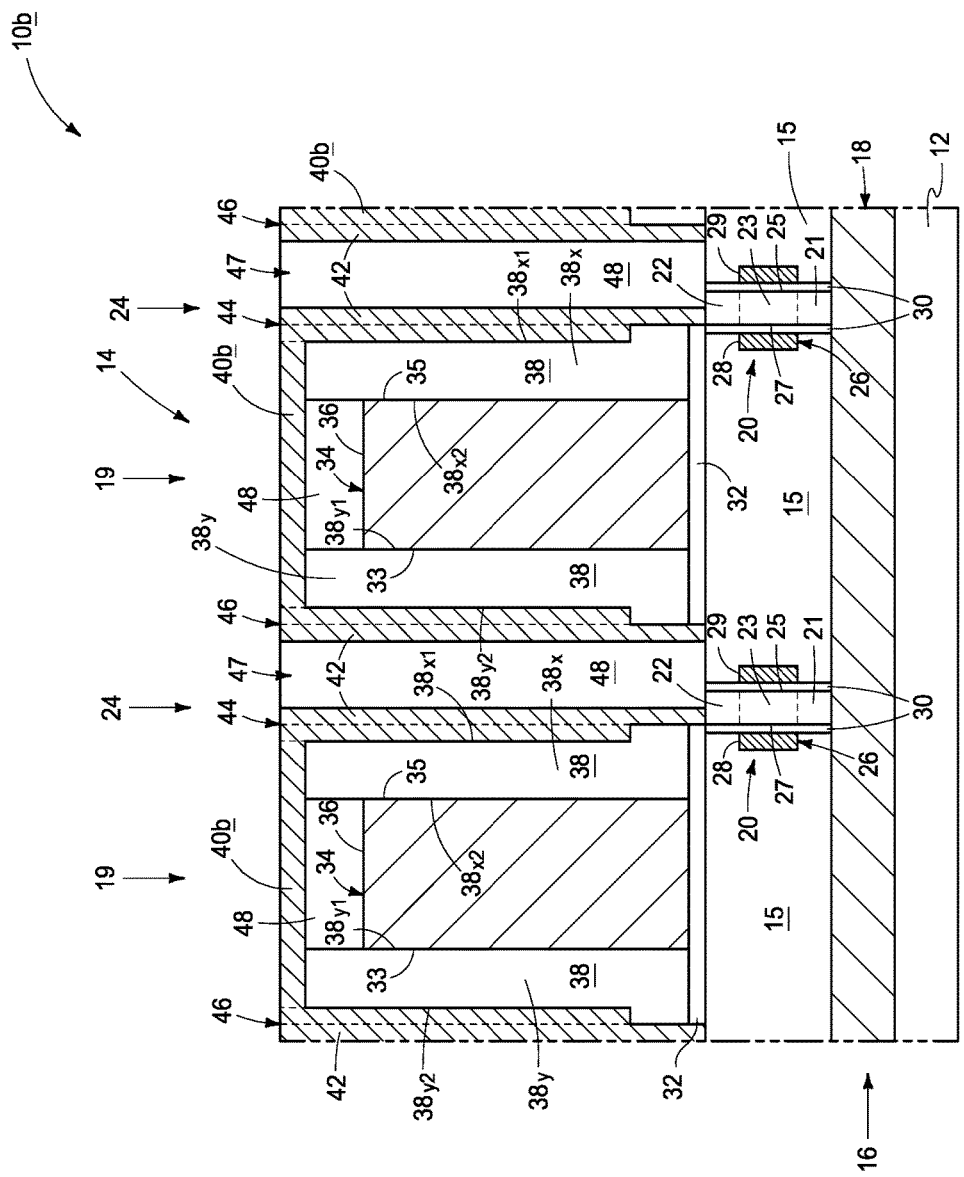
FIG. 26 is a front elevational view of the FIGS. 24 and 25 construction at a processing step subsequent to that shown by FIGS. 24 and 25, and is taken through line 26-26 in FIG. 27.
Figure 27:
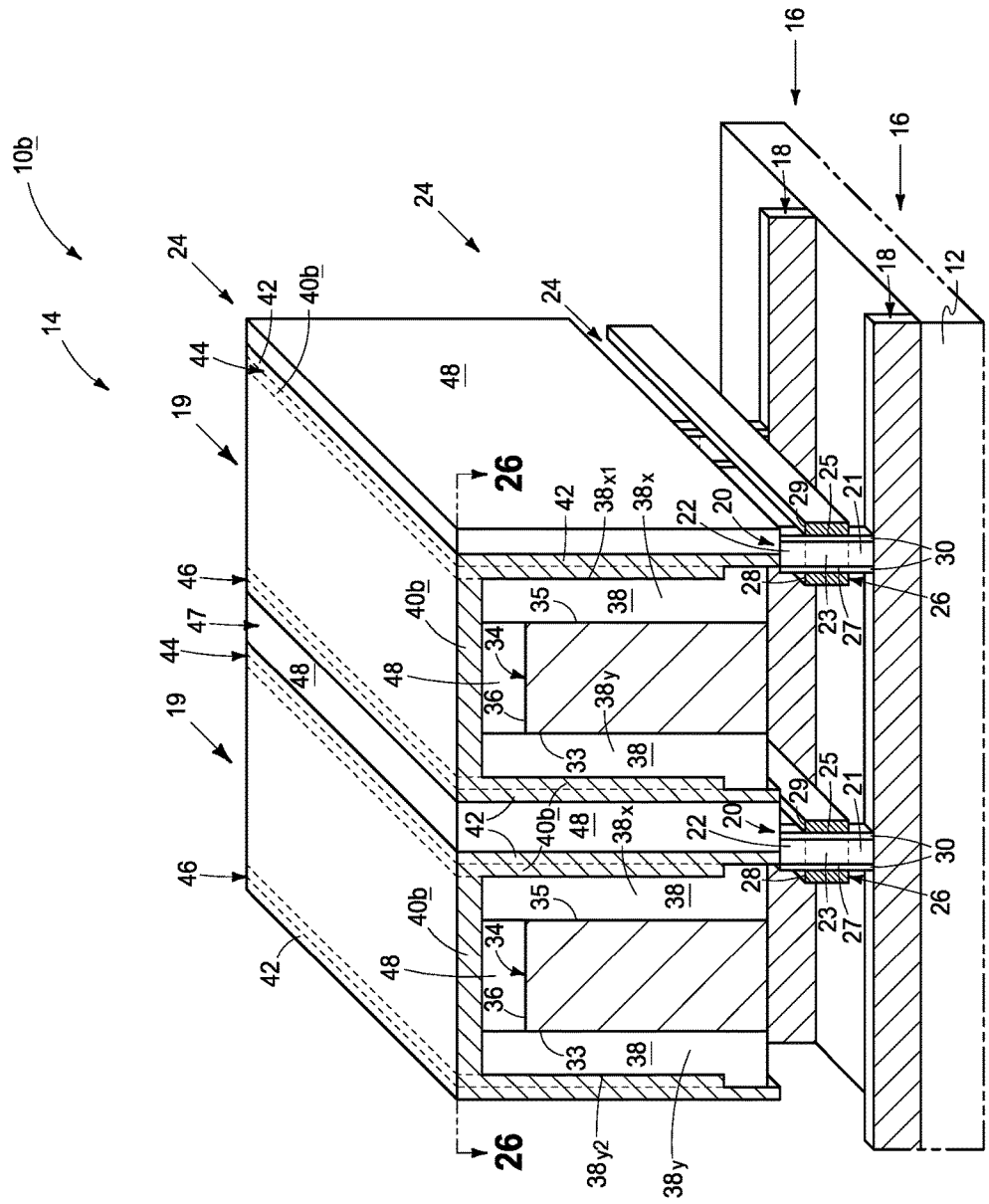
FIG. 27 is a perspective view of the FIG. 26 construction.

Referring to FIGS. 26 and 27, insulator material 48 has been deposited and planarized back at least to an elevationally-outermost surface of conductive lines 44, 46 and conductive material 40b.

Figure 28:
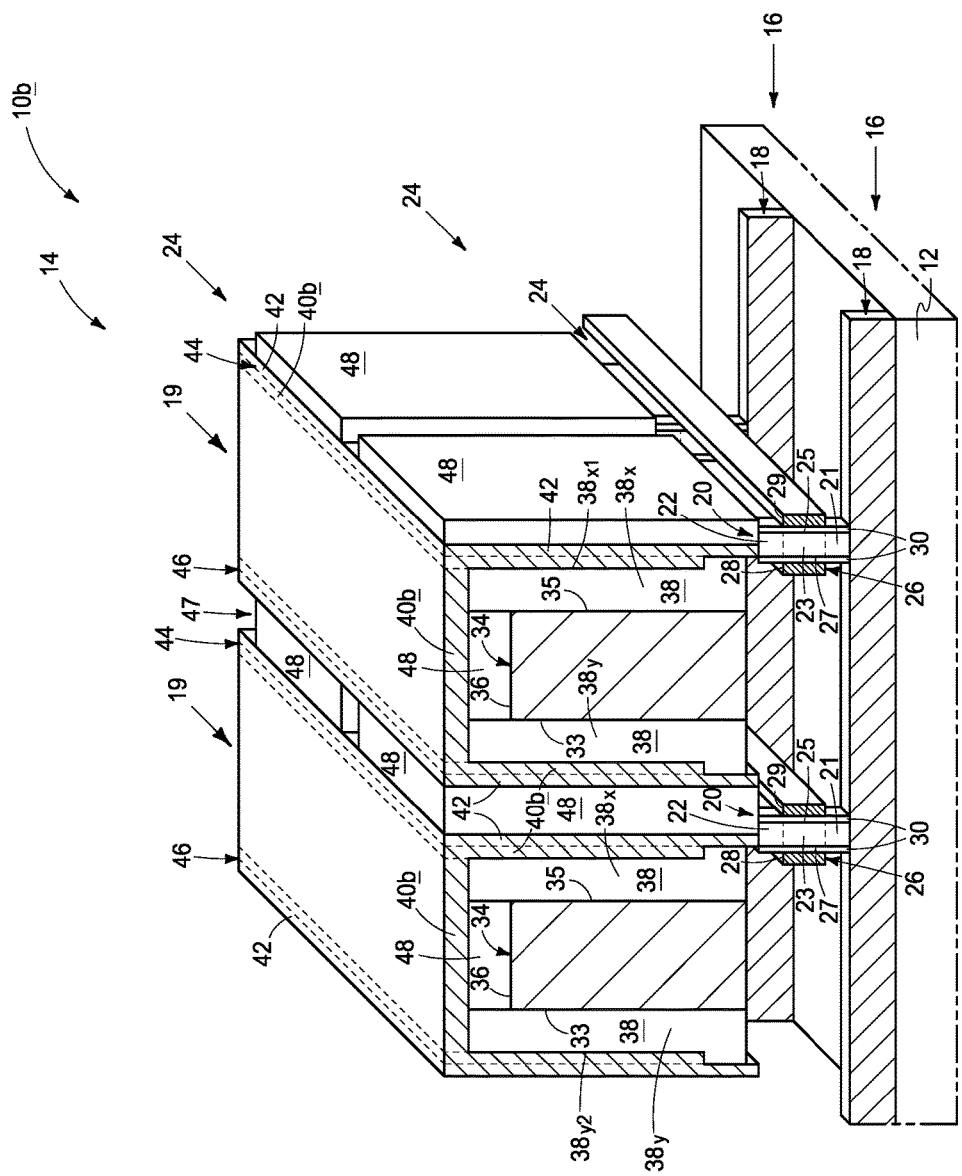
FIG. 28 is a view of the FIG. 27 construction at a processing step subsequent to that shown by FIGS. 26 and 27.

Referring to FIG. 28, insulator material 48 has been patterned (e.g., using photolithography with or without pitch multiplication) to expose portions of laterally-outermost sides of conductive lines 44, 46.

Figure 29:
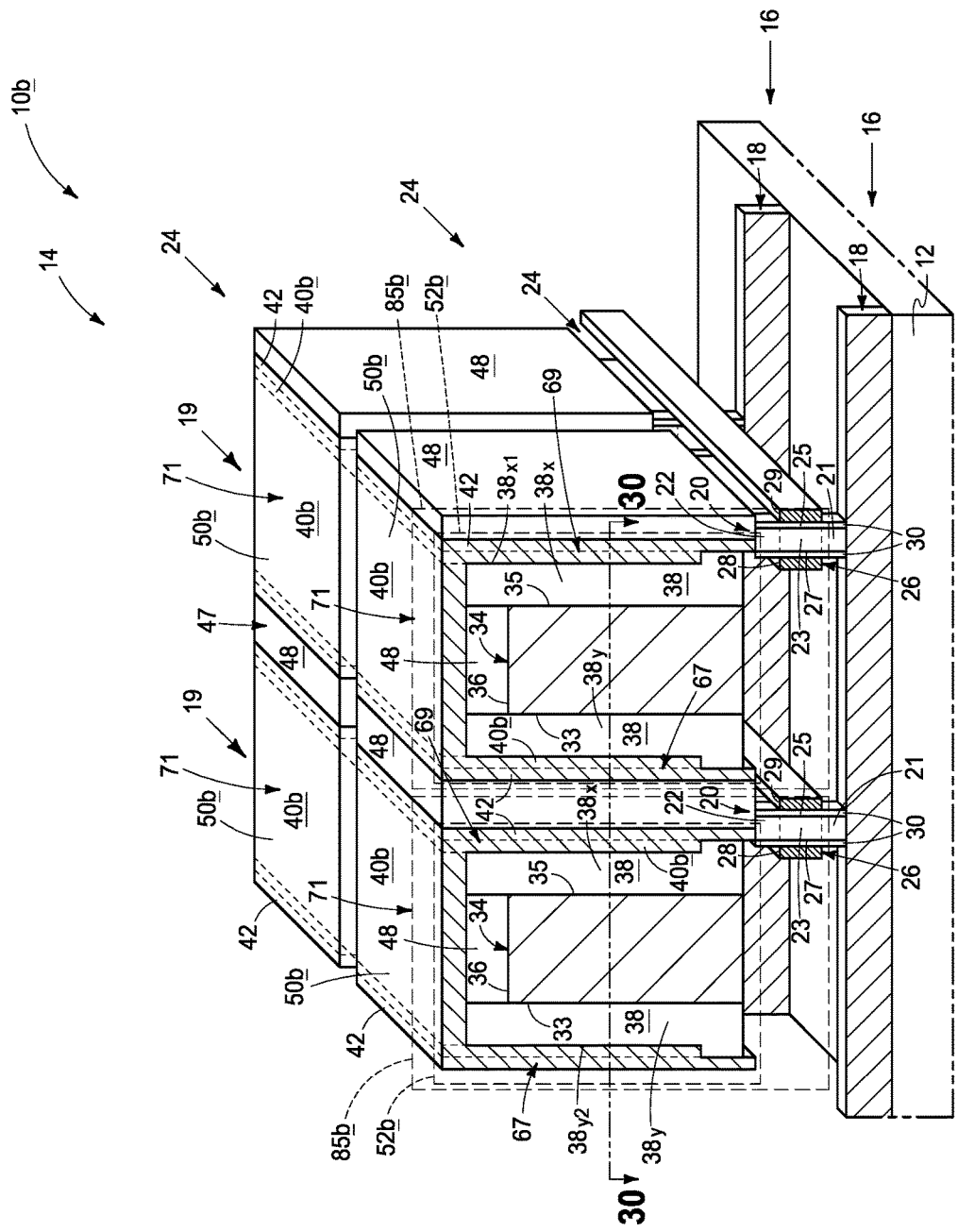
FIG. 29 is a view of the FIG. 28 construction at a processing step subsequent to that shown by FIG. 28.
Figure 30:
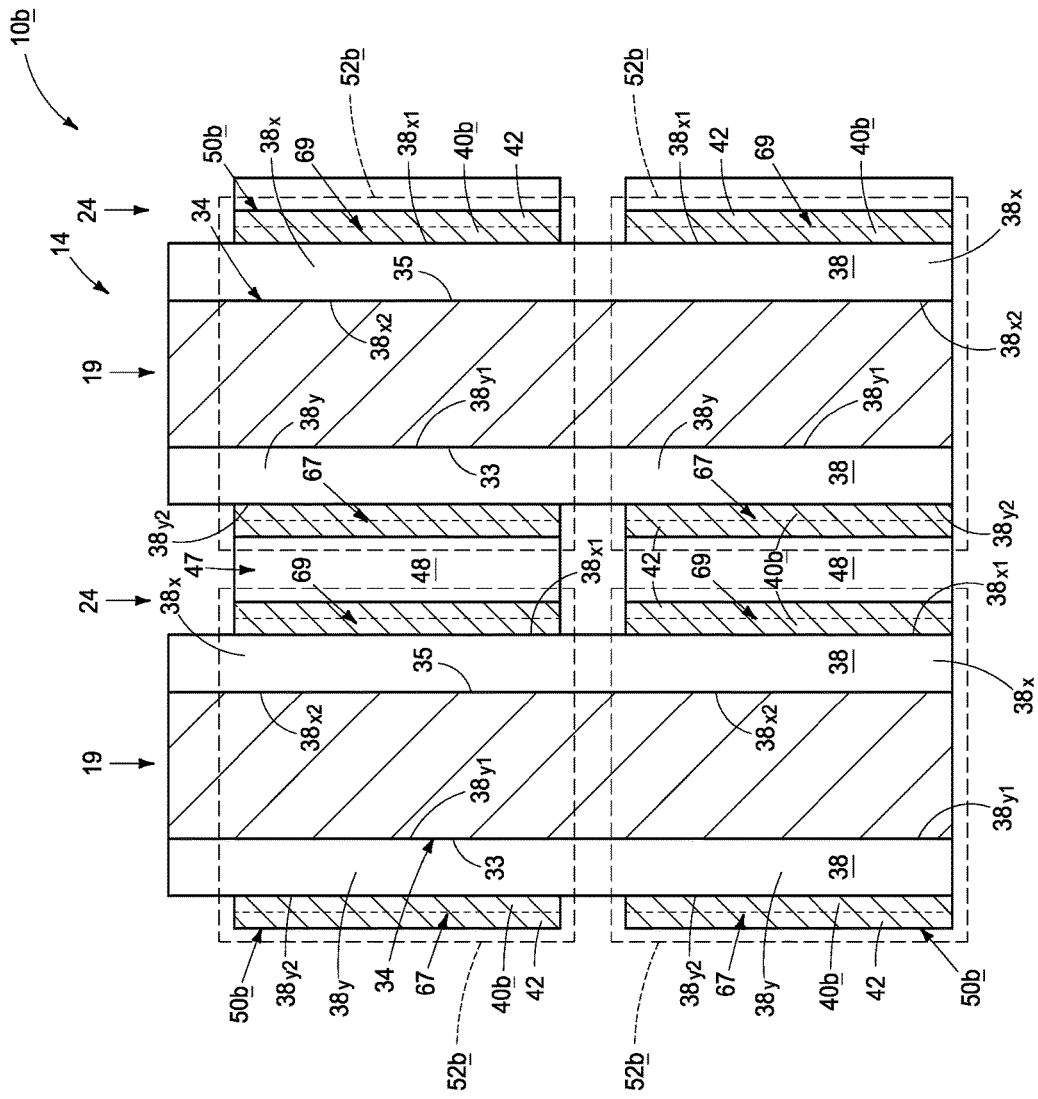
FIG. 30 is a cross-sectional view taken through line 30-30 in FIG. 29.

Referring to FIGS. 29 and 30, conductive lines 44 and conductive lines 46 (neither being numerically designated in FIGS. 29, 30) of FIG. 28 have been cut laterally through on each of laterally-opposing sides 33, 35 of individual capacitor electrode lines 34 and through laterally-extending conductive material 40b to form spaced individual other/first electrodes 50b of the two capacitor electrodes of individual capacitors 52b. Such cutting forms individual other/first capacitor electrodes 50b to comprise an elevationally-extending first member 69 that is directly electrically coupled to and extends elevationally upward from upper source/drain regions 22 of individual transistors 20 longitudinally along that line 24 of transistors 20 on laterally-opposing side 35 of individual capacitor electrode lines 34. Such act of cutting also forms individual other/first capacitor electrodes 50b to comprise an elevationally-extending second member 67 that is laterally spaced from first member 69 and on other laterally-opposing side 33 of individual capacitor electrode lines 34. Such act of cutting also forms laterally-extending conductive material 40b as an interconnecting member/part 71 (FIG. 29) of spaced individual other/first electrodes 50b of individual capacitors 52b. Accordingly, and in one embodiment, a portion of other/first capacitor electrode 50b is on other laterally-opposing side 33 of second capacitor electrode line 34. In the first embodiment, a first/other capacitor electrode (e.g., 50x) of another capacitor (e.g., 52x) was on other laterally-opposing side 33 of second capacitor electrode line 34. FIGS. 29 and 30 show fabrication of four memory cells 85b (only two being designated with numerals in FIG. 29), although again with likely hundreds of thousands, millions, etc. memory cells 85b being formed within array 14.

In one embodiment, first member 69 from side-to-side is formed to be entirely solid from top to bottom in horizontal cross-section, for example as shown. In one embodiment and as shown, second member 67 from side-to-side is formed to be entirely solid from top to bottom in horizontal cross-section, for example as shown. Any other attribute(s) or aspect(s) as described herein and/or shown may be used.

An embodiment of the invention encompasses a method of forming an array of capacitors independent of whether such are formed as part of a memory array or individually as part of a memory cell, and independent of whether transistors are formed. Such an embodiment comprises forming elevationally-extending and longitudinally-elongated capacitor electrode lines (e.g., 34) over a substrate (e.g., 12). Individual of the capacitor electrode lines are common to and a shared one of two capacitor electrodes of individual capacitors (e.g., 52x, 52y, 52b, or 52c [below]) longitudinally along a line (e.g., 19 or 19x) of capacitors being formed. A capacitor insulator (e.g., 38) is formed over a pair of laterally-opposing sides (e.g., 33, 35) of and longitudinally along individual of the capacitor electrode lines. An elevationally-extending conductive line (e.g., 44 or 46) is formed over the capacitor insulator longitudinally along one of the laterally-opposing sides of the individual capacitor electrode lines. The conductive line is laterally cut through to form spaced individual other electrodes (e.g., 50x, 50y, or 50b) of the two capacitor electrodes of the individual capacitors (e.g., 52x, 52y, or 52b). Any other attribute(s) or aspect(s) as described herein and/or shown may be used.

FIGS. 18-20 show fabrication of upper memory cells 85U and lower memory cells 85L within one tier/deck/level of an array of memory cells. FIGS. 29 and 30 also show fabrication of one tier/deck/level of an array of memory cells 85b. In any embodiment, additional tiers/decks/levels may be provided or fabricated above or below the one tier/deck/level depicted in the Figures. Alternately, only one single such tier/deck/level may be fabricated.

In one embodiment, methods in accordance with the invention comprise forming the individual memory cells to be 1T-1C. These individual memory cells are characterized by having only one transistor and only one capacitor and no other/additional operable electronic component (e.g., no other select device, etc.), yet may also include conductive material interconnecting the transistor and capacitor together and the individual memory cell to other components outside of the individual memory cells.

In one embodiment, the array within a tier of the memory cells is formed to have translational symmetry where individual of the memory cells are 1T-1C and occupy a horizontal area of $2F^2$, where "F" is memory cell pitch taken horizontally, laterally, and orthogonally through individual of the capacitor electrode lines, the capacitor insulator, and the other capacitor electrodes. In one embodiment, "F" is memory cell pitch taken horizontally, laterally, and orthogonally through individual of the second capacitor electrode lines, the capacitor insulator, and the first capacitor electrodes. In one embodiment, "F" is memory cell pitch taken horizontally, laterally, and orthogonally through individual of the first capacitor electrodes, the first capacitor insulators, the shared second capacitor electrodes, the second capacitor insulators, and the third capacitor electrodes. In one of any such embodiments, the horizontal area is formed to be horizontally bounded by a 1F by 2F rectangle, for example as is shown in FIG. 17A with respect to a rectangle 99.

Embodiments of the invention also encompass forming the individual memory cells to be 2T-2C. Such memory cells are characterized by having only two transistors and only two capacitors and no other/additional operable electronic component (e.g., no other select device, etc.), yet may also include conductive material interconnecting the two transistors to the two capacitors and the individual memory cell to other components outside of the individual memory cells. A 2T-2C memory cell architecture is shown schematically in FIG. 31 as a memory cell 2. The two transistors of the memory cell are labeled as T1 and T2, and the two capacitors are labeled as CAP-1 and CAP-2. A source/drain region of first transistor T1 connects with a node of first capacitor (CAP-1), and the other source/drain region of T1 connects with a first comparative bit line (BL-1). A gate of T1 connects with a word line (WL). A source/drain region of second transistor T2 connects with a node of second capacitor (CAP-2), and the other source/drain region of T2 connects with a second comparative bit line BL-2. A gate of T2 connects with word line WL. Each of the first and second capacitors (CAP-1 and CAP-2) has a node electrically coupled with a common plate (CP). The common plate may be coupled with any suitable voltage. Comparative bit lines BL-1 and BL-2 extend to circuitry 4 which compares electrical properties (e.g., voltage) of the two to ascertain a memory state of memory cell 2. An advantage of a 2T-2C memory cell is that a memory state may be ascertained by comparing the electrical properties of the two comparative bit lines BL-1 and BL-2 to one another. Accordingly, a reference bit line associated with other memory (for instance, 1T-1C memory) may be omitted. In such an embodiment, BL-1 and BL-2 may be electrically coupled to the same sense amplifier as part of circuitry 4.

Figure 31:
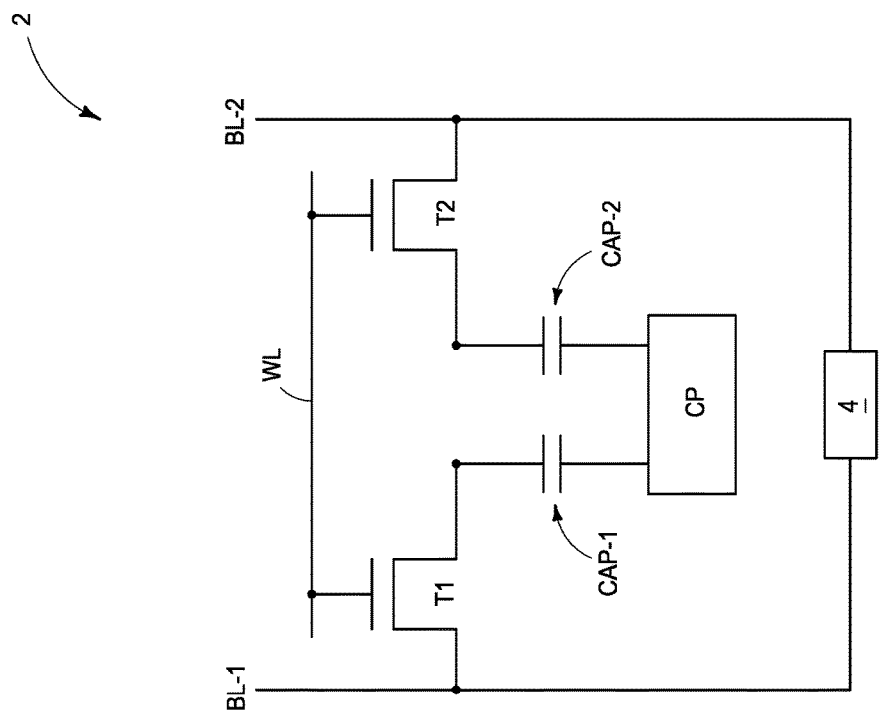
FIG. 31 is a schematic of a two transistor/two capacitor memory (2T/2C) cell in accordance with an embodiment of the invention.
Figure 32:
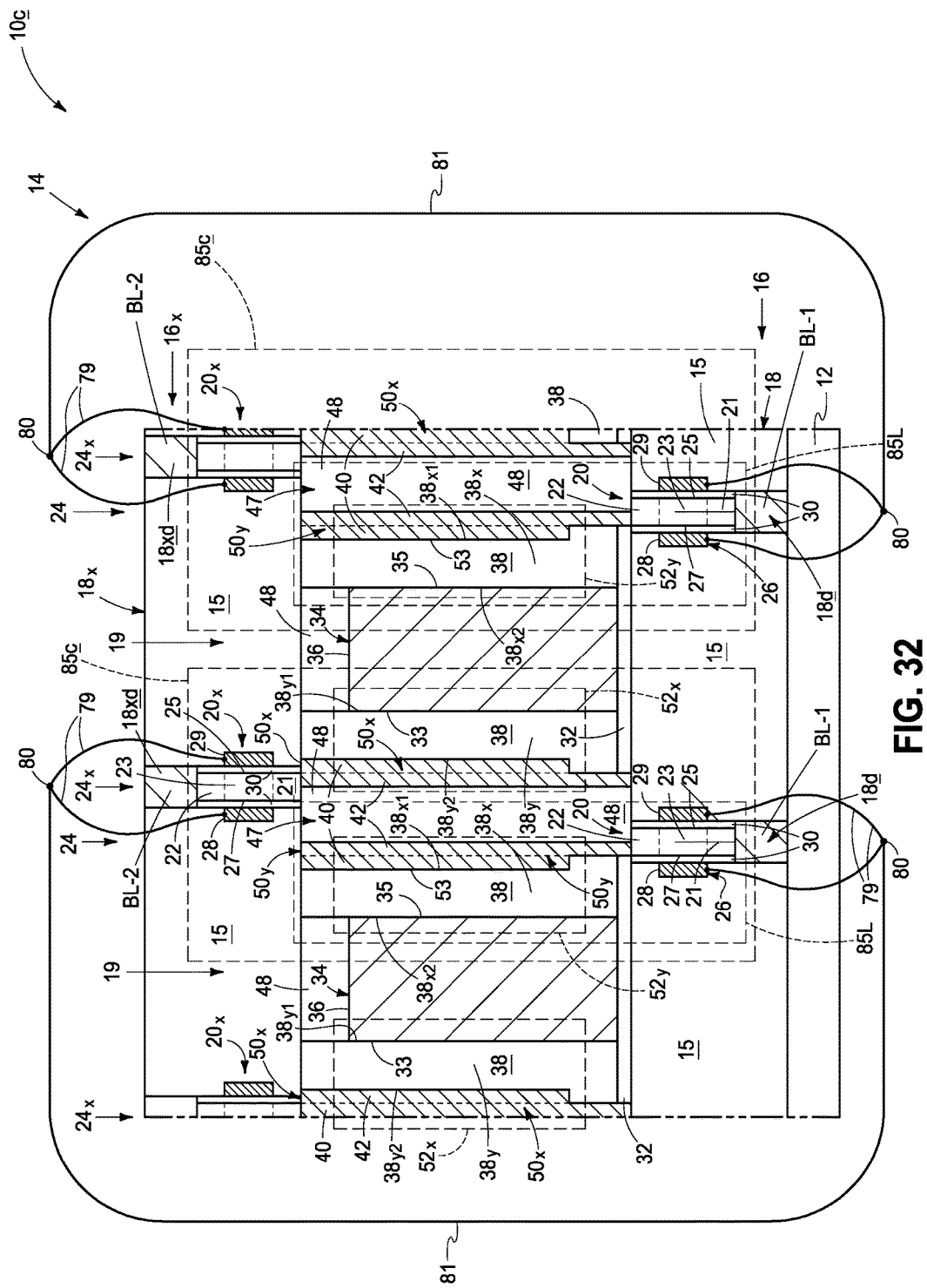
FIG. 32 is a hybrid schematic and diagrammatic front elevational view of a 2T/2C construction in accordance with an embodiment of the invention.

An alternate embodiment construction to that of FIG. 19 that may comprise 2T-2C architecture like that shown in FIG. 31 is shown in FIG. 32. Like numerals from the above-described embodiments have been used where appropriate, with some construction differences being indicated with the suffix "c". Construction 10c comprises individual memory cells 85c of 2T-2C architecture and which may be volatile or non-volatile depending on composition of the capacitor insulator. Pairs of immediately elevationally adjacent transistors 20, 20x are shown having their respective gates directly electrically coupled together to comprise one 2T-2C memory cell 85c of the array. Such is shown schematically in FIG. 32 by conductive interconnects 79 extending to a node 80 for the depicted two such individual pairs, and a conductive interconnect 81 connecting pairs of respective nodes 80 together. Construction (not shown) for interconnects 79, 81, and nodes 80 may be within and/or out-of-the-plane of the page upon which FIG. 32 lies and may be within and/or outside of array 14. Data/sense lines 18d and 18xd (or extensions thereof) have been reconfigured as shown and in accordance with the FIG. 31 schematic for BL-1 and BL-2. Any other attribute(s) or aspect(s) as described herein and/or shown may be used.

Embodiments of the invention encompass an array of memory cells (e.g., 85b, 85c, 85U, 85L) independent of method of manufacture. However, an array of memory cells independent of method of fabrication may have any of the attribute(s) or aspect(s) as described above and/or shown.

In one embodiment, an array (e.g., 14) of memory cells (e.g., 85b, 85c, 85L) individually comprising a capacitor (e.g., 52y, 52b, 52c) and a transistor (e.g., 20), and with the array comprising rows (e.g., 24) of access lines (e.g., 26) and columns (e.g., 16) of data/sense lines (e.g., 18), has individual of the columns comprising a data/sense line electrically coupled with one source/drain region (e.g., 21) of individual transistors of individual memory cells within the array and interconnecting the transistors in that column. Individual of the rows comprise an access line above the data/sense lines. The access line extends operatively adjacent the transistor channels (e.g., 23) and interconnects the transistors in that row. Capacitors of the individual memory cells within the array individually comprise a first capacitor electrode (e.g., 50y, 50b, 50c) electrically coupled to and extending elevationally upward from another source/drain region (e.g., 22) of one of the individual transistors. An elevationally-extending capacitor insulator (e.g., 38x) comprises a pair of laterally-opposing sides (e.g., 38x1 and 38x2). One of the laterally-opposing sides (e.g., 38x1) of the capacitor insulator is directly against a lateral side (e.g., 53) of the first capacitor electrode. An elevationally-extending second capacitor electrode (e.g., 34) comprises a pair of laterally-opposing sides (e.g. 33, 35). One of the laterally-opposing sides (e.g., 35) of the second capacitor electrode is directly against the other laterally-opposing side (e.g., 38x2) of the capacitor insulator. The second capacitor electrodes within the array are spaced longitudinally-elongated lines extending horizontally along lines (e.g., 19) of the capacitors. Individual of the second capacitor electrode lines are shared by capacitors longitudinally along that line of capacitors. Any other attribute(s) or aspect(s) as described herein and/or shown may be used.

In one embodiment, an array (e.g., 14) of memory cells (e.g., 85, 85b, 85c, 85L) individually comprising a capacitor (e.g., 52y, 52b, 52c) and a transistor (e.g., 20), and with the array comprising rows (e.g., 24) of access lines (e.g., 26) and columns (e.g., 16) of data/sense lines (e.g., 18), has individual of the columns comprising a data/sense line under channels (e.g., 23) electrically coupled with one source/drain region (e.g., 21) of individual transistors of individual memory cells within the array and interconnect the transistors in that column. Individual of the rows comprise an access line above the data/sense lines. The access line extends operatively adjacent the transistor channels (e.g., 23) and interconnects the transistors in that row. Capacitors of the individual memory cells within the array individually comprise a first capacitor electrode (e.g., 50y, 50b, 50c) electrically coupled to and extending elevationally upward from another source/drain region (e.g., 22) of one of the individual transistors. The first capacitor electrodes individually from top to bottom are laterally-thinnest at the bottom. An elevationally-extending capacitor insulator (e.g., 38x) comprises a pair of laterally-opposing sides (e.g., 38x1 and 38x2). One of the laterally-opposing sides (e.g., 38x1) of the capacitor insulator is directly against a lateral side (e.g., 53) of the first capacitor electrode. An elevationally-extending second capacitor electrode (e.g., 34) comprises a pair of laterally-opposing sides (e.g. 33, 35). One of the laterally-opposing sides (e.g., 35) of the second capacitor electrode is directly against the other laterally-opposing side (e.g., 38x2) of the capacitor insulator (e.g., independent of whether the second capacitor electrodes within the array are spaced longitudinally-elongated lines extending horizontally along lines of the capacitors, and independent of any such lines being shared by capacitors longitudinally along that line of capacitors). Any other attribute(s) or aspect(s) as described herein and/or shown may be used.

In one embodiment, an array (e.g., 14) of memory cells (e.g., 85b, 85c, 85L) individually comprising a capacitor (e.g., 52y, 52b, 52c) and an elevationally-extending transistor (e.g., 20), and with the array comprising rows (e.g., 24) of access lines (e.g., 26) and columns (e.g., 16) of data/sense lines (e.g., 18), has individual of the columns comprising a data/sense line under channels (e.g., 23) of elevationally-extending transistors of individual memory cells within the array and interconnecting the transistors in that column. Individual of the rows comprise an access line above the data/sense lines. The access line extends laterally across and operatively laterally adjacent a lateral side (e.g., 25 and/or 27) of the transistor channels and interconnects the transistors in that row. Capacitors of the individual memory cells within the array individually comprise a first capacitor electrode (e.g., 50y, 50b, 50c) directly against and extending elevationally upward from an uppermost surface of an upper source/drain region (e.g., 22) of one of the transistors, such first capacitor electrode being directly against less than all of the uppermost surface of the upper source/drain region. An elevationally-extending capacitor insulator (e.g., 38x) comprises a pair of laterally-opposing sides (e.g., 38x1 and 38x2). One of the laterally-opposing sides (e.g., 38x1) of the capacitor insulator is directly against a lateral side (e.g., 53) of the first capacitor electrode. An elevationally-extending second capacitor electrode (e.g., 34) comprises a pair of laterally-opposing sides (e.g. 33, 35). One of the laterally-opposing sides (e.g., 35) of the second capacitor electrode is directly against the other laterally-opposing side (e.g., 38x2) of the capacitor insulator (e.g., independent of whether the second capacitor electrodes within the array are spaced longitudinally-elongated lines extending horizontally along lines of the capacitors, and independent of any such lines being shared by capacitors longitudinally along that line of capacitors). Any other attribute(s) or aspect(s) as described herein and/or shown may be used.

In one embodiment, an array (e.g., 14) of memory cells (e.g., 85U, 85L, 85c) individually comprising a capacitor (e.g., 52x, 52y, 52c) and an elevationally-extending transistor (e.g., 20, 20x), and with the array comprising rows (e.g., 24, 24x) of access lines (e.g., 26, 26x) and columns (e.g., 16, 16x) of data/sense lines (e.g., 18, 18x), has a lower column (e.g., 16) comprising a lower data/sense line (e.g., 18) under channels (e.g., 23) of elevationally-extending lower transistors (e.g., 20) of individual lower memory cells (e.g., 85L) within the array and interconnecting the lower transistors in that lower column. An upper column (e.g., 16x) comprising an upper data/sense line (e.g., 18x) is above channels (e.g., 23) of elevationally-extending upper transistors (e.g., 20x) of individual upper memory cells (e.g., 85U) within the array and interconnects the upper transistors in that upper column. A lower row (e.g., 24) comprising a lower access line (e.g., 26) is above the lower data/sense lines. The lower access line extends laterally across and operatively laterally adjacent a lateral side (e.g., 25 and/or 27) of channels of the lower transistors and interconnects the lower transistors in that lower row. An upper row (e.g., 24x) comprising an upper access line (e.g., 26x) is below the upper data/sense lines. The upper access line extends laterally across and operatively laterally adjacent a lateral side of channels of the upper transistors and interconnects the upper transistors in that upper row. The array includes pairs of laterally-adjacent capacitors (e.g., 52x and 52y), with such the pairs individually comprising a first capacitor electrode (e.g., 50y) electrically coupled (in one embodiment directly electrically coupled) to and extending elevationally upward from an upper source/drain region (e.g., 22) of one of the lower transistors. An elevationally-extending first capacitor insulator (e.g., 38x) comprises a pair of laterally-opposing sides (e.g., 38x1 and 38x2) one of which (e.g., 38x1) is directly against a lateral side (e.g., 53) of the first capacitor electrode. An elevationally-extending shared second capacitor electrode (e.g., 34) is shared by the capacitors of the individual pairs of capacitors and comprises a pair of laterally-opposing sides (e.g., 33, 35). One of such sides (e.g., 35) is directly against the other laterally-opposing side (e.g., 38x2) of the first capacitor insulator. An elevationally-extending second capacitor insulator (e.g., 38y) comprises a pair of laterally-opposing sides (e.g., 38y1, 38y2). One of such sides (e.g., 38y1) is directly against the other laterally-opposing side (e.g., 33) of the shared second capacitor electrode. A third capacitor electrode (e.g., 50x) is electrically coupled (in one embodiment directly electrically coupled) to and extends elevationally downward from a lower source/drain region (e.g., 21) of one of the upper transistors. The other laterally-opposing side (e.g., 38y2) of the second capacitor insulator is directly against a lateral side (e.g., 55) of the third capacitor electrode. Any other attribute(s) or aspect(s) as described herein and/or shown may be used.

In one embodiment, an array (e.g., 14) of memory cells (e.g., 85b) individually comprising a capacitor (e.g., 52b) and an elevationally-extending transistor (e.g., 20), and with the array comprising rows (e.g., 24) of access lines (e.g., 26) and columns (e.g., 16) of data/sense lines (e.g., 18), has individual of the columns comprising a data/sense line under channels (e.g., 23) of elevationally-extending transistors of individual memory cells within the array and interconnecting the transistors in that column. Individual of the rows comprise an access line above the data/sense lines. The access line extends laterally across and operatively laterally adjacent a lateral side (e.g., 25 and/or 27) of the transistor channels and interconnects the transistors in that row. Capacitors of the individual memory cells within the array individually comprise a first capacitor electrode (e.g., 50b) comprising an elevationally-extending first member (e.g., 69) directly electrically coupled to and extending elevationally upward from an upper source/drain region (e.g., 22) of one of the transistors. An elevationally-extending second member (e.g., 67) is laterally spaced from the first member. A laterally-extending conductive member (e.g., 71) directly electrically couples the first and second members together. The first and second members are directly electrically coupled together only by the laterally-extending conductive member. An elevationally-extending second capacitor electrode (e.g., 34) is laterally between the first and second members of the first capacitor electrode. An elevationally-extending capacitor insulator (e.g., 38x) is laterally between the first member of the first capacitor electrode and elevationally-extending capacitor insulator (e.g., 38y) is laterally between the second member of the first capacitor electrode and the second capacitor electrode. Any other attribute(s) or aspect(s) as described herein and/or shown may be used.

Embodiments of the invention encompass an array of capacitors independent of method of manufacture. However, an array of capacitors independent of method of fabrication may have any of the attribute(s) or aspect(s) as described above and/or shown. In but one embodiment, the capacitors (e.g., 52*y*, 52*b*, 52*c*) of an array of capacitors individually comprise a first capacitor electrode (e.g., 50*y*, 50*b*, 50*c*) electrically coupled (in one embodiment directly electrically coupled) to and extending elevationally upward from an upper source/drain region (e.g., 22) of one of the transistors. An elevationally-extending capacitor insulator (e.g., 38*x*) comprises a pair of laterally-opposing sides (e.g., 38*x*1 and 38*x*2). One of the laterally-opposing sides (e.g., 38*x*1) of the capacitor insulator is directly against a lateral side (e.g., 53) of the first capacitor electrode. An elevationally-extending second capacitor electrode (e.g., 34) comprises a pair of laterally-opposing sides (e.g. 33, 35). One of the laterally-opposing sides (e.g., 35) of the second capacitor electrode is directly against the other laterally-opposing side (e.g., 38*x*2) of the capacitor insulator. The second capacitor electrodes within the array are spaced longitudinally-elongated lines extending horizontally along lines (e.g., 24) of the capacitors. Individual of the second capacitor electrode lines are shared by capacitors longitudinally along that line of capacitors. Any other attribute(s) or aspect(s) as described herein and/or shown may be used.

CONCLUSION

In some embodiments, a method of forming an array of capacitors comprises forming elevationally-extending and longitudinally-elongated capacitor electrode lines over a substrate. Individual of the capacitor electrode lines are common to and a shared one of two capacitor electrodes of individual capacitors longitudinally along a line of capacitors being formed. A capacitor insulator is formed over a pair of laterally-opposing sides of and longitudinally along individual of the capacitor electrode lines. An elevationally-extending conductive line is formed over the capacitor insulator longitudinally along one of the laterally-opposing sides of the individual capacitor electrode lines. The conductive line is cut laterally through to form spaced individual other of the two capacitor electrodes of the individual capacitors.

In some embodiments, a method of forming an array of memory cells individually comprising a capacitor and a transistor comprises forming transistors over columns of data/sense lines. Individual of the transistors comprise a source/drain region electrically coupled to one of the data/sense lines. The transistors comprise rows of access lines above the data/sense lines. Individual of the access lines extend operatively adjacent transistor channels and interconnect the transistors in that row. Elevationally-extending and longitudinally-elongated capacitor electrode lines are formed. Individual of the capacitor electrode lines are common to and a shared one of two capacitor electrodes of individual capacitors longitudinally along a line of capacitors being formed longitudinally along a line of the transistors. A capacitor insulator is formed over a pair of laterally-opposing sides of and longitudinally along individual of the capacitor electrode lines. An elevationally-extending conductive line is formed over the capacitor insulator longitudinally along one of the laterally-opposing sides of the individual capacitor electrode lines longitudinally along individual of the lines of transistors. Individual of the conductive lines are electrically coupled to individual source/drain regions of individual transistors longitudinally along that line of transistors. The conductive lines are laterally cut through to form spaced individual other of the two capacitor electrodes of the individual capacitors.

In some embodiments, a method of forming an array of memory cells individually comprising a capacitor and an elevationally-extending transistor comprises forming elevationally-extending lower transistors over lower columns of lower data/sense lines. Individual of the lower transistors comprises a lower source/drain region directly electrically coupled to one of the lower data/sense lines. The lower transistors comprise lower rows of lower access lines above the lower data/sense lines. Individual of the lower access lines extend laterally across and operatively laterally adjacent a lateral side of lower transistor channels and interconnect the lower transistors in that lower row. Elevationally-extending and longitudinally-elongated capacitor electrode lines are formed. Individual of the capacitor electrode lines are common to and a shared one of two capacitor electrodes of individual capacitors longitudinally along a line of capacitors being formed longitudinally along a line of the lower transistors. A capacitor insulator is formed over laterally-opposing sides longitudinally along individual of the capacitor electrode lines. An elevationally-extending conductive line is formed over the capacitor insulator longitudinally along each of a pair of laterally-opposing sides of the individual capacitor electrode lines longitudinally along individual of the lines of lower transistors. Individual of the conductive lines on one of the laterally-opposing sides of the individual capacitor electrode lines are directly electrically coupled to upper source/drain regions of individual lower transistors longitudinally along that line of lower transistors. The conductive lines are laterally cut through on each of the laterally-opposing sides of the individual capacitor electrode lines to form spaced individual other of the two capacitor electrodes of the individual capacitors. Elevationally-extending upper transistors are formed over individual of the other of the two capacitor electrodes of the individual capacitors on the other of the laterally-opposing sides of the individual capacitor electrode lines. The individual other of the two capacitor electrodes are directly electrically coupled to lower source/drain regions of individual upper transistors longitudinally along a line of upper transistors. The upper transistors comprise upper rows of upper access lines above the other of the two capacitor electrodes of the individual capacitors on the other of the laterally-opposing sides of the individual capacitor electrode lines. Individual of the upper access lines extend laterally across and operatively laterally adjacent a lateral side of upper transistor channels and interconnect the upper transistors in that upper row. Upper columns of upper data/sense lines are formed above channels of the upper transistors. Individual of upper source/drain regions of the upper transistors are directly electrically coupled to one of the upper data/sense lines, with the one data/sense line interconnecting the upper transistors in that upper column.

In some embodiments, a method of forming an array of memory cells individually comprising a capacitor and an elevationally-extending transistor comprises forming elevationally-extending transistors over columns of data/sense lines. Individual of the transistors comprise a lower source/drain region directly electrically coupled to one of the data/sense lines. The transistors comprise rows of access lines above the data/sense lines. Individual of the access lines extend laterally across and operatively laterally adjacent a lateral side of transistor channels and interconnect the transistors in that row. Elevationally-extending and longitudinally-elongated capacitor electrode lines are formed. Individual of the capacitor electrode lines are common to and a shared one of two capacitor electrodes of individual capacitors longitudinally along a line of capacitors being formed longitudinally along a line of the transistors. A capacitor insulator is formed over a pair of laterally-opposing sides of and longitudinally along individual of the capacitor electrode lines and over the tops of the individual capacitor electrode lines. An elevationally-extending conductive line is formed over the capacitor insulator longitudinally along each of a pair of laterally-opposing sides of the individual capacitor electrode lines. Individual of the conductive lines on one of the laterally-opposing sides of the individual capacitor electrode lines are directly electrically coupled to upper source/drain regions of individual transistors longitudinally along that line of transistors. Laterally-extending conductive material that is atop the capacitor insulator that is over the tops of the respective individual capacitor electrode lines directly electrically couples together the conductive lines that are along each of a pair of laterally-opposing sides of the respective individual capacitor electrode lines. The conductive lines are cut laterally through on each of the laterally-opposing sides of the individual capacitor electrode lines and the laterally-extending conductive material is laterally cut through to form spaced individual other of the two capacitor electrodes of the individual capacitors. The cutting forms individual of the other capacitor electrodes to comprise an elevationally-extending first member directly electrically coupled to and extending elevationally upward from the upper source/drain regions of the individual transistors longitudinally along that line of transistors on the one laterally-opposing side of the individual capacitor electrode lines. The cutting forms individual of the other capacitor electrodes to comprise an elevationally-extending second member laterally spaced from the first member on the other laterally-opposing side of the individual capacitor electrode lines. The cutting forms the laterally-extending conductive material as part of the spaced individual other of the two capacitor electrodes of the individual capacitors.

In some embodiments, an array of capacitors has individual capacitors within the array individually comprising a first capacitor electrode over a substrate. The capacitors individually comprise an elevationally-extending capacitor insulator that comprises a pair of laterally-opposing sides. One of the laterally-opposing sides of the capacitor insulator is directly against a lateral side of the first capacitor electrode. The capacitors individually comprise an elevationally-extending second capacitor electrode comprising a pair of laterally-opposing sides. One of the laterally-opposing sides of the second capacitor electrode is directly against the other laterally-opposing side of the capacitor insulator. The second capacitor electrodes within the array are spaced longitudinally-elongated lines extending horizontally along lines of the capacitors. Individual of the second capacitor electrode lines are shared by capacitors longitudinally along that line of capacitors.

In some embodiments, an array of memory cells individually comprising a capacitor and a transistor, where the array comprises rows of access lines and columns of data/sense lines, has individual of the columns comprising a data/sense line electrically coupled with one source/drain region of individual transistors of individual memory cells within the array and interconnects the transistors in that column. Individual of the rows comprise an access line above the data/sense lines. The access line extends operatively adjacent the transistor channels and interconnects the transistors in that row. Capacitors of the individual memory cells within the array individually comprise a first capacitor electrode electrically coupled to and extending elevationally upward from another source/drain region of one of the individual transistors. The capacitors individually comprise an elevationally-extending capacitor insulator comprising a pair of laterally-opposing sides. One of the laterally-opposing sides of the capacitor insulator is directly against a lateral side of the first capacitor electrode. The capacitors individually comprise an elevationally-extending second capacitor electrode comprising a pair of laterally-opposing sides. One of the laterally-opposing sides of the second capacitor electrode is directly against the other laterally-opposing side of the capacitor insulator. The second capacitor electrodes within the array are spaced longitudinally-elongated lines extending horizontally along lines of the capacitors. Individual of the second capacitor electrode lines are shared by capacitors longitudinally along that line of capacitors.

In some embodiments, an array of memory cells individually comprising a capacitor and a transistor comprises rows of access lines and columns of data/sense lines, with the array having individual of the columns comprising a data/sense line electrically coupled with one source/drain region of individual transistors of individual memory cells within the array and interconnecting the transistors in that column. Individual of the rows comprise an access line above the data/sense lines. The access line extends operatively adjacent the transistor channels and interconnects the transistors in that row. Capacitors of the individual memory cells within the array individually comprise a first capacitor electrode electrically coupled to and extending elevationally upward from another source/drain region of one of the individual transistors. The first capacitor electrodes individually from top to bottom are laterally-thinnest at the bottom. The capacitors individually comprise an elevationally-extending capacitor insulator comprising a pair of laterally-opposing sides. One of the laterally-opposing sides of the capacitor insulator is directly against a lateral side of the first capacitor electrode. An elevationally-extending second capacitor electrode comprises a pair of laterally-opposing sides. One of the laterally-opposing sides of the second capacitor electrode is directly against the other laterally-opposing side of the capacitor insulator.

In some embodiments, an array of memory cells individually comprises a capacitor and an elevationally-extending transistor, with the array comprising rows of access lines and columns of data/sense lines, has individual of the columns comprising a data/sense line under channels of elevationally-extending transistors of individual memory cells within the array and interconnects the transistors in that column. Individual of the rows comprise an access line above the data/sense lines. The access line extends laterally across and operatively laterally adjacent a lateral side of the transistor channels and interconnects the transistors in that row. Capacitors of the individual memory cells within the array individually comprise a first capacitor electrode directly against and extending elevationally upward from an uppermost surface of an upper source/drain region of one of the transistors. The first capacitor electrode is directly against less than all of the uppermost surface of the upper source/drain region. The capacitors individually comprise an elevationally-extending capacitor insulator comprising a pair of laterally-opposing sides. One of the laterally-opposing sides of the capacitor insulator is directly against a lateral side of the first capacitor electrode. The capacitors individually comprise an elevationally-extending second capacitor electrode comprising a pair of laterally-opposing sides. One of the laterally-opposing sides of the second capacitor electrode is directly against the other laterally-opposing side of the capacitor insulator.

In some embodiments, an array of memory cells individually comprising a capacitor and an elevationally-extending transistor, with the array comprising rows of access lines and columns of data/sense lines, has a lower column comprising a lower data/sense line under channels of elevationally-extending lower transistors of individual lower memory cells within the array and interconnects the lower transistors in that lower column. An upper column comprises an upper data/sense line above channels of elevationally-extending upper transistors of individual upper memory cells within the array and interconnects the upper transistors in that upper column. A lower row comprises a lower access line above the lower data/sense lines. The lower access line extends laterally across and operatively laterally adjacent a lateral side of channels of the lower transistors and interconnects the lower transistors in that lower row. An upper row comprises an upper access line below the upper data/sense lines. The upper access line extends laterally across and operatively laterally adjacent a lateral side of channels of the upper transistors and interconnects the upper transistors in that upper row. Pairs of laterally-adjacent capacitors and included, with the pairs of laterally-adjacent capacitors individually comprising a first capacitor electrode directly electrically coupled to and extending elevationally upward from an upper source/drain region of one of the lower transistors. The pairs individually comprise an elevationally-extending first capacitor insulator comprising a pair of laterally-opposing sides. One of the laterally-opposing sides of the first capacitor insulator is directly against a lateral side of the first capacitor electrode. An elevationally-extending shared second capacitor electrode is shared by the capacitors of the individual pairs of capacitors. The shared second capacitor electrode comprises a pair of laterally-opposing sides. One of the laterally-opposing sides of the shared second capacitor electrode is directly against the other laterally-opposing side of the first capacitor insulator. The pairs individually comprise an elevationally-extending second capacitor insulator comprising a pair of laterally-opposing sides. One of the laterally-opposing sides of the second capacitor insulator is directly against the other laterally-opposing side of the shared second capacitor electrode. A third capacitor electrode is directly electrically coupled to and extends elevationally downward from a lower source/drain region of one of the upper transistors. The other laterally-opposing side of the second capacitor insulator is directly against a lateral side of the third capacitor electrode.

In some embodiments, an array of memory cells individually comprising a capacitor and an elevationally-extending transistor, with the array comprising rows of access lines and columns of data/sense lines, has individual of the columns comprising a data/sense line under channels of elevationally-extending transistors of individual memory cells within the array and interconnects the transistors in that column. Individual of the rows comprise an access line above the data/sense lines. The access line extends laterally across and operatively laterally adjacent a lateral side of the transistor channels and interconnects the transistors in that row. Capacitors of the individual memory cells within the array individually comprise a first capacitor electrode comprising an elevationally-extending first member directly electrically coupled to and extending elevationally upward from an upper source/drain region of one of the transistors. The first capacitor electrodes individually comprise an elevationally-extending second member laterally spaced from the first member. The first capacitor electrodes individually comprise a laterally-extending conductive member directly electrically coupling the first and second members together. The first and second members are directly electrically coupled together only by the laterally-extending conductive member. The capacitors individually comprise an elevationally-extending second capacitor electrode laterally between the first and second members of the first capacitor electrode. The capacitors individually comprise an elevationally-extending capacitor insulator laterally between the first member of the first capacitor electrode and the second capacitor electrode and laterally between the second member of the first capacitor electrode and the second capacitor electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of memory cells individually comprising a capacitor and an elevationally-extending transistor, comprising:

forming elevationally-extending transistors over columns of data/sense lines, individual of the transistors comprising a lower source/drain region directly electrically coupled to one of the data/sense lines, the transistors comprising rows of access lines above the data/sense lines, individual of the access lines extending laterally across and operatively laterally adjacent a lateral side of transistor channels and interconnecting the transistors in that row;

forming elevationally-extending and longitudinally-elongated capacitor electrode lines, individual of the capacitor electrode lines being common to and a shared one of two capacitor electrodes of individual capacitors longitudinally along a line of capacitors being formed longitudinally along a line of the transistors;

forming a capacitor insulator over a pair of laterally-opposing sides of and longitudinally along individual of the capacitor electrode lines and over the tops of the individual capacitor electrode lines;

forming an elevationally-extending conductive line over the capacitor insulator longitudinally along each of a pair of laterally-opposing sides of the individual capacitor electrode lines, individual of the conductive lines on one of the laterally-opposing sides of the individual capacitor electrode lines being directly electrically coupled to upper source/drain regions of individual transistors longitudinally along that line of transistors, laterally-extending conductive material atop the capacitor insulator that is over the tops of the respective individual capacitor electrode lines directly electrically coupling together the conductive lines that are along each of a pair of laterally-opposing sides of the respective individual capacitor electrode lines; and cutting laterally through the conductive lines on each of the laterally-opposing sides of the individual capacitor electrode lines and through the laterally-extending conductive material to form spaced individual other of the two capacitor electrodes of the individual capacitors, the cutting forming individual of the other capacitor electrodes to comprise an elevationally-extending first member directly electrically coupled to and extending elevationally upward from the upper source/drain regions of the individual transistors longitudinally along that line of transistors on the one laterally-opposing side of the individual capacitor electrode lines, the cutting forming individual of the other capacitor electrodes to comprise an elevationally-extending second member laterally spaced from the first member on the other laterally-opposing side of the individual capacitor electrode lines, and the cutting forming the laterally-extending conductive material as part of the spaced individual other of the two capacitor electrodes of the individual capacitors.

2. The method of claim 1 comprising forming the first member from side-to-side to be entirely solid from top to bottom in horizontal cross-section.

3. The method of claim 1 comprising forming the second member from side-to-side to be entirely solid from top to bottom in horizontal cross-section.

4. The method of claim 1 comprising forming the first members and the second members to extend longitudinally along their respective second capacitor electrode line a greater horizontal distance than horizontal distance of space between immediately-longitudinally-adjacent of the first members an immediately-longitudinally-adjacent of the second members along that line of capacitors.

5. An array of memory cells individually comprising a capacitor and an elevationally-extending transistor, the array comprising rows of access lines and columns of data/sense lines, comprising:
   individual of the columns comprising a data/sense line under channels of elevationally-extending transistors of individual memory cells within the array and interconnecting the transistors in that column;
   individual of the rows comprising an access line above the data/sense lines, the access line extending laterally across and operatively laterally adjacent a lateral side of the transistor channels and interconnecting the transistors in that row; and
   capacitors of the individual memory cells within the array individually comprising:
      a first capacitor electrode comprising:
         an elevationally-extending first member directly electrically coupled to and extending elevationally upward from an upper source/drain region of one of the transistors;
         an elevationally-extending second member laterally spaced from the first member; and
         a laterally-extending conductive member directly electrically coupling the first and second members together, the first and second members being directly electrically coupled together only by the laterally-extending conductive member;
      an elevationally-extending second capacitor electrode laterally between the first and second members of the first capacitor electrode; and
      an elevationally-extending capacitor insulator laterally between the first member of the first capacitor electrode and the second capacitor electrode and laterally between the second member of the first capacitor electrode and the second capacitor electrode.

6. The array of claim 5 wherein the laterally-extending conductive member is atop the first and second members.

7. The array of claim 5 wherein,
   the second capacitor electrodes within the array are spaced longitudinally-elongated lines extending horizontally along lines of the capacitors, individual of the second capacitor electrode lines being shared by capacitors longitudinally along that line of capacitors; and
   individual of the first members and individual of the second members being longitudinally co-extensive with the laterally-extending conductive member longitudinally along its second capacitor electrode lines.

8. The array of claim 7 wherein the first members and the second members extend longitudinally along their respective second capacitor electrode line a greater horizontal distance than horizontal distance of space between immediately-longitudinally-adjacent of the first capacitor electrodes along that line of capacitors.

* * * * *